United States Patent
Itasaka

(10) Patent No.: US 9,252,789 B2
(45) Date of Patent: Feb. 2, 2016

(54) OSCILLATOR CIRCUIT, VIBRATORY DEVICE, ELECTRONIC APPARATUS, MOVING OBJECT, METHOD OF ADJUSTING VIBRATORY DEVICE, AND SENSITIVITY ADJUSTMENT CIRCUIT

(71) Applicant: Seiko Epson Corporation, Tokyo (JP)

(72) Inventor: Yosuke Itasaka, Tatsuno (JP)

(73) Assignee: Seiko Epson Corporation (JP)

( * ) Notice: Subject to any disclaimer, the term of this patent is extended or adjusted under 35 U.S.C. 154(b) by 3 days.

(21) Appl. No.: 14/036,413

(22) Filed: Sep. 25, 2013

(65) Prior Publication Data

US 2014/0091872 A1 Apr. 3, 2014

(30) Foreign Application Priority Data

Sep. 28, 2012 (JP) ................................ 2012-217440

(51) Int. Cl.
*H03L 7/099* (2006.01)
*H03L 1/02* (2006.01)
*H03B 5/36* (2006.01)

(52) U.S. Cl.
CPC ............... *H03L 7/099* (2013.01); *H03B 5/362* (2013.01); *H03B 5/364* (2013.01); *H03L 1/028* (2013.01); *H03B 2201/0258* (2013.01); *H03J 2200/10* (2013.01)

(58) Field of Classification Search
CPC .................................................. H03J 220/10
USPC ..... 331/36 C, 116 R, 154, 158, 177 R, 177 V
See application file for complete search history.

(56) References Cited

U.S. PATENT DOCUMENTS

| | | | |
|---|---|---|---|
| 6,040,744 A | 3/2000 | Sakurai et al. | |
| 6,239,662 B1 | 5/2001 | Fukayama et al. | |
| 6,559,730 B1 * | 5/2003 | Marvin et al. | 331/158 |
| 6,788,159 B2 * | 9/2004 | Takahashi et al. | 331/176 |
| 7,212,076 B1 * | 5/2007 | Taheri et | 331/177 V |
| 7,986,194 B2 * | 7/2011 | Kiyohara et al. | 331/158 |
| 2002/0180544 A1 * | 12/2002 | Fukayama et al. | 331/176 |
| 2006/0208816 A1 * | 9/2006 | Ohshima et al. | 331/158 |
| 2008/0309424 A1 | 12/2008 | Shen et al. | |
| 2009/0039970 A1 * | 2/2009 | Shen et al. | 331/158 |

(Continued)

FOREIGN PATENT DOCUMENTS

| | | |
|---|---|---|
| JP | 09-102714 | 4/1997 |
| JP | 11-088052 | 3/1999 |

(Continued)

*Primary Examiner* — Jeffrey Shin
(74) *Attorney, Agent, or Firm* — Harness, Dickey & Pierce, P.L.C.

(57) ABSTRACT

An oscillator circuit includes a terminal T1, a terminal T2, a variable capacitance element having one end connected to the terminal T1, and a capacitance value varying in accordance with a frequency control signal, a variable capacitance element having one end connected to the terminal T2, and a capacitance value varying in accordance with the frequency control signal, a load capacitance circuit connected to the terminal T1, and a load capacitance circuit connected to the terminal T2, and oscillates a resonator element at a frequency corresponding to the frequency control signal. The oscillator circuit is capable of adjusting the capacitance values of the load capacitance circuits, a reference voltage (the electrical potential of the terminal T1), and a reference voltage (the electrical potential of the terminal T2) in accordance with configuration information.

12 Claims, 21 Drawing Sheets

(56) References Cited

U.S. PATENT DOCUMENTS

2014/0091868 A1    4/2014    Ishikawa et al.
2014/0091872 A1    4/2014    Itasaka

FOREIGN PATENT DOCUMENTS

JP    2007-019565 A    1/2007
WO    WO-2005-046046 A1    5/2005

* cited by examiner

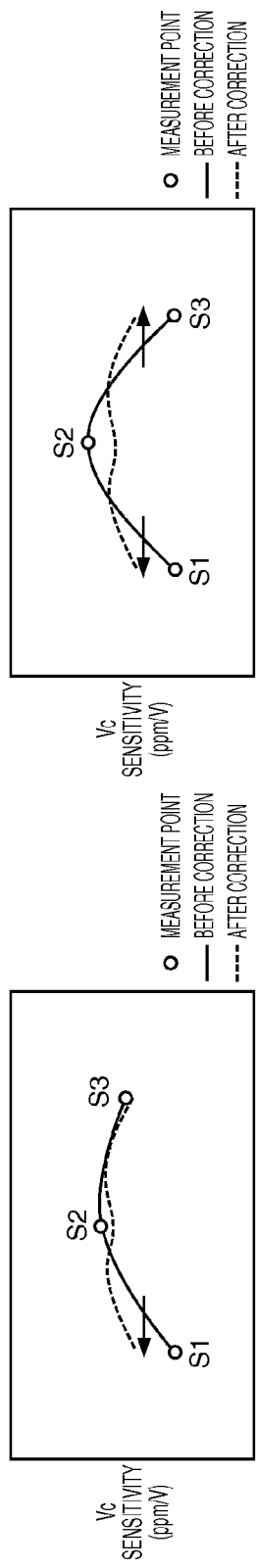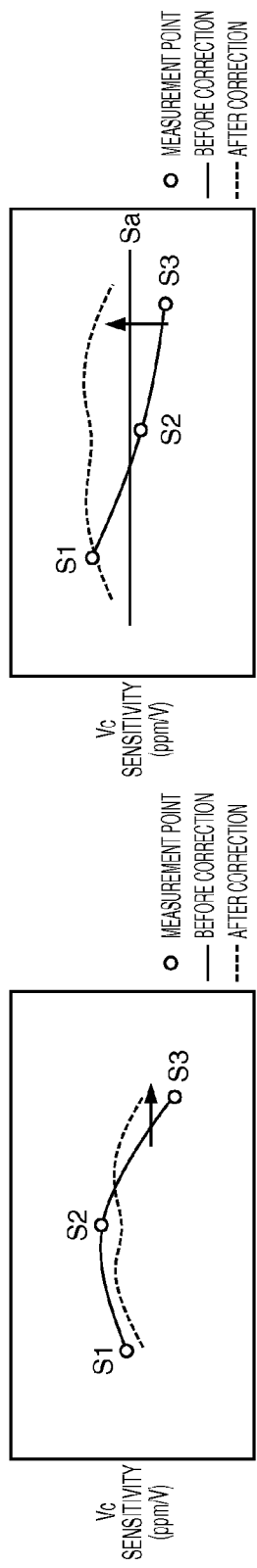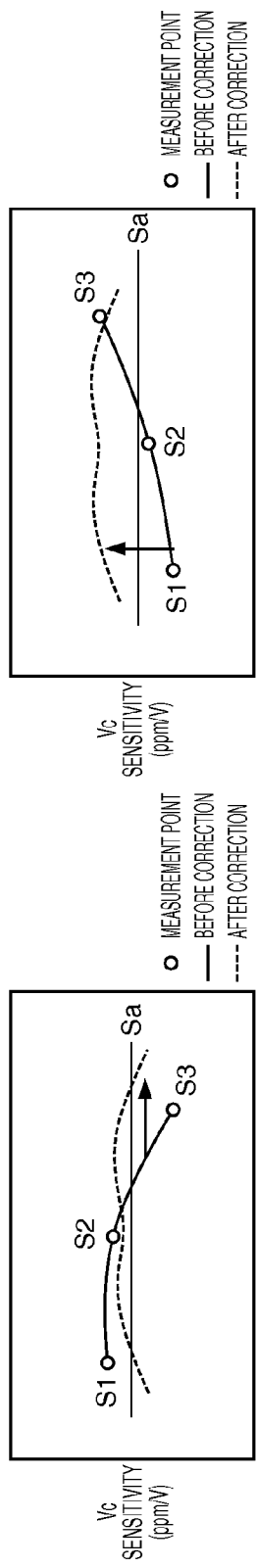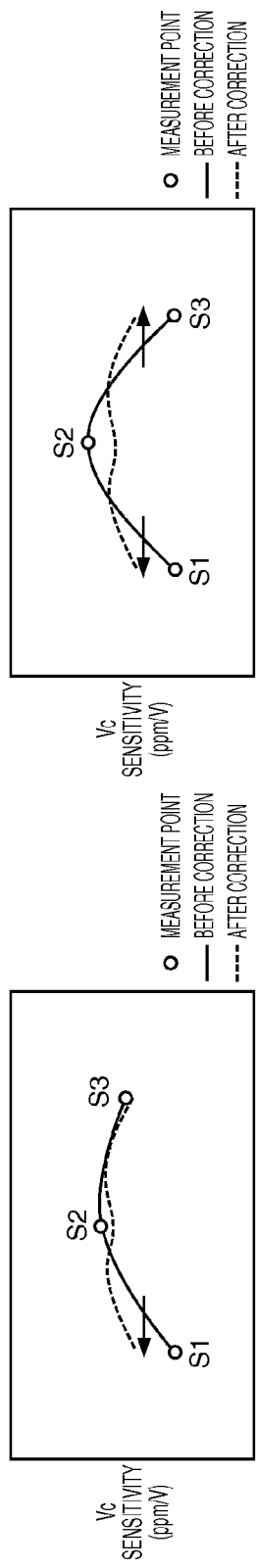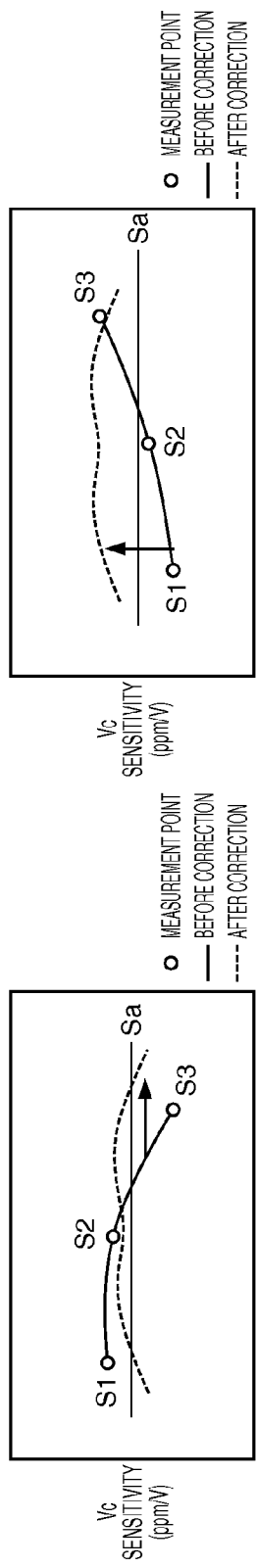

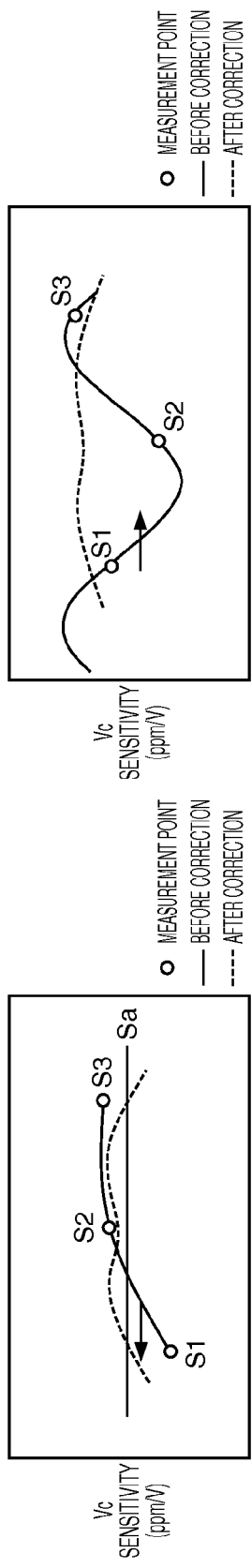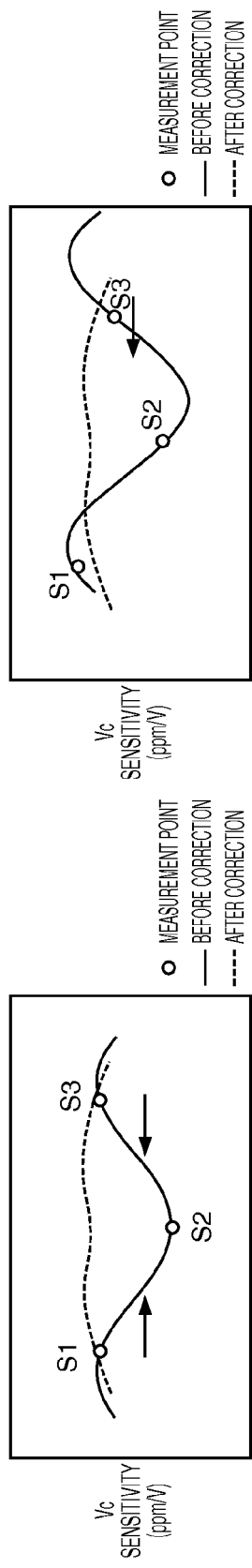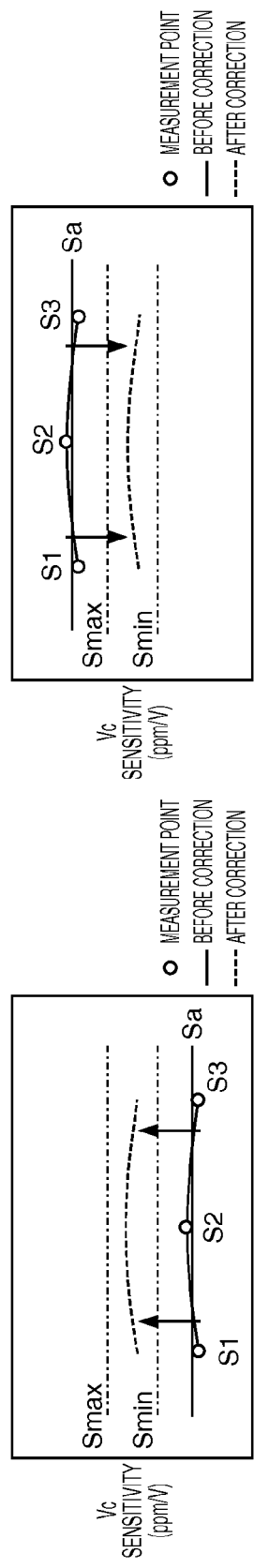

| | VCSES_ADJ[1:0] | VIBRATOR | Vc SENSITIVITY | OSCILLATION AMPLITUDE |
|---|---|---|---|---|
| MODE 1 | 00 | TYPE 1 | 50ppm/V | 1.2V |
| MODE 2 | 01 | TYPE 2 (HIGH VIBRATOR SENSITIVITY) | 50ppm/V | 1.2V |
| MODE 3 | 10 | TYPE 1 | 40ppm/V | 1.2V |
| MODE 4 | 11 | TYPE 1 | 50ppm/V | 0.8V |
FIG. 11
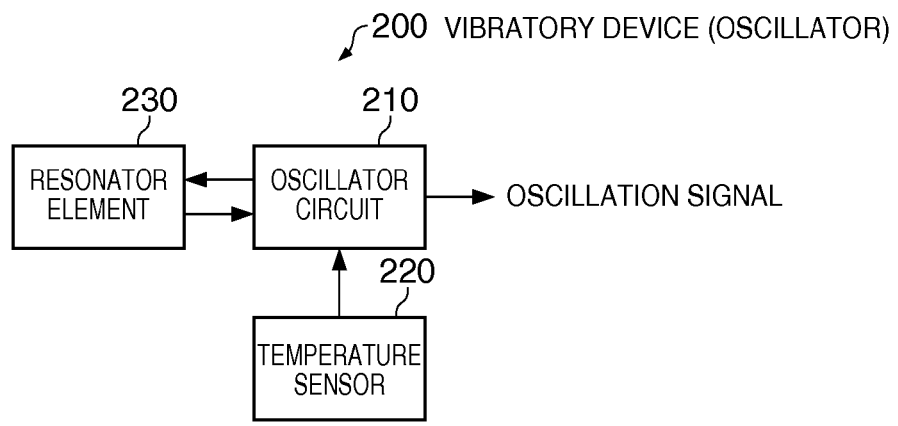
FIG. 12A
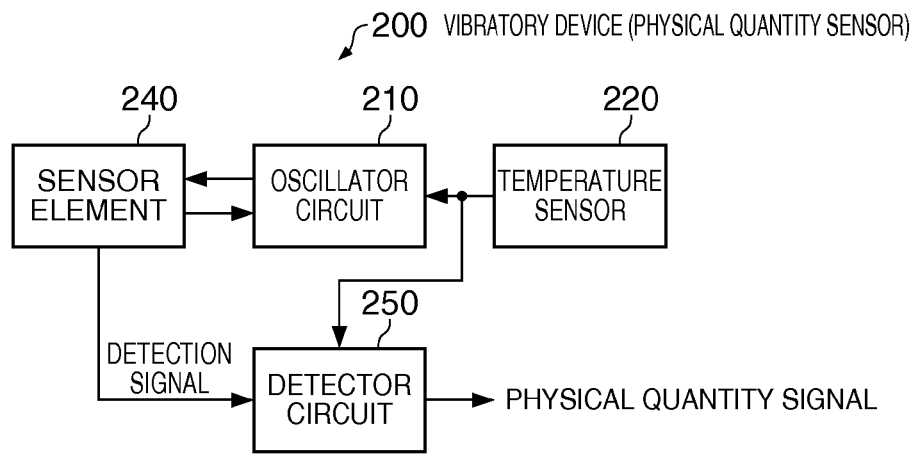
FIG. 12B

OSCILLATOR CIRCUIT, VIBRATORY DEVICE, ELECTRONIC APPARATUS, MOVING OBJECT, METHOD OF ADJUSTING VIBRATORY DEVICE, AND SENSITIVITY ADJUSTMENT CIRCUIT

BACKGROUND

1. Technical Field

The present invention relates to an oscillator circuit, a vibratory device, an electronic apparatus, a moving object, a method of adjusting a vibratory device, and a sensitivity adjustment circuit.

2. Related Art

Voltage controlled oscillators (VCO) capable of varying the oscillation frequency in accordance with a control voltage are widely known, and are used for a variety of purposes. Among these oscillators, a voltage controlled X'tal oscillator (VCXO) using a crystal vibrator is high in frequency stability, and is used for a variety of purposes.

In general, in the voltage controlled oscillator (VCO), since the resolution of the frequency adjustment is deteriorated if the frequency control voltage sensitivity (Vc sensitivity) defined as the variation of frequency to the variation of the frequency control voltage (Vc) is too high, and the range in which the frequency can be adjusted becomes insufficient if the Vc sensitivity is too low, the Vc sensitivity is required to be at a desired level. However, in reality, since the Vc sensitivity is not the same between individual voltage controlled oscillators due to manufacturing factors and so on, adjustment of the Vc sensitivity is necessary for each of the voltage controlled oscillators.

Further, the adjustment of the Vc sensitivity is also necessary in the case of making it possible to deal with a plurality of types of vibrators different in vibrator sensitivity. The vibrator sensitivity $S_{Xtal}$, the frequency control voltage sensitivity (the Vc sensitivity) $S_V$, and the adjustment frequency $\Delta F$ are calculated by Formulas (1) through (3) below, respectively.

$$S_{Xtal} = \frac{-C_1}{2 \cdot (C_0 + C_L)^2} \times 1E^6 (ppm/pF) \quad (1)$$

$$S_V = S_{Xtal} \times \frac{\Delta C_L}{\Delta V_C} (ppm/V) \quad (2)$$

$$\Delta F = \int_{V_c}^{V_c+\Delta V_c} S_V \times dVc (ppm) \quad (3)$$

In Formulas (1) through (3), $C_0$ denotes a vibrator parallel capacitance, $C_1$ denotes a vibrator series capacitance, $C_L$ denotes an oscillator load capacitance, and $V_C$ denotes the frequency control voltage.

According to Formulas (1) through (3), if attempting to deal with a plurality of types of vibrators different in vibrator sensitivity, it is necessary to perform a gain adjustment of the frequency control voltage Vc, an adjustment of $C_L$, or an adjustment of $\Delta C_L/\Delta Vc$.

In the past, as described in, for example, JP-A-9-102714 (Document 1), it is commonly performed that the value of $C_L$ is changed by changing the value of the load capacitance connected to each of the input side and the output side of the vibrator to thereby adjust the Vc sensitivity.

FIGS. 19A and 19B are circuit diagrams of the related art oscillators using an inverter and a bipolar transistor as an amplifier element, respectively. In either of the cases, a variable capacitance element (a varactor) having a capacitance value varying in accordance with the frequency control voltage Vc and a capacitance bank composed of a plurality of capacitance element and a plurality of switches are connected to the both ends (the both ends of the amplifier element) of the vibrator, and by adjusting the capacitance value of the capacitance bank in accordance with a setting value stored in a memory, the Vc sensitivity is adjusted so as to have a desired level.

The variation of the capacitance value to the variation of the electrical potential difference between the both ends of the variable capacitance element has the maximum value when the electrical potential difference between the both ends is a certain electrical potential difference Vt. Therefore, the Vc sensitivity due to the variable capacitance element on the input side of the amplifier element takes the maximum value when the control voltage Vc is shifted by Vt from electrical potential V1 on the input side of the amplifier element. On the other hand, the Vc sensitivity due to the variable capacitance element on the output side of the amplifier element takes the maximum value when the control voltage Vc is shifted by Vt from electrical potential V2 on the output side of the amplifier element. The overall Vc sensitivity of the oscillator is obtained by combining the two Vc sensitivities, and becomes the characteristic corresponding to the electrical potential difference between V1 and V2. It should be noted that although Vt varies depending on the characteristics of the variable capacitance elements, the explanation will hereinafter be presented assuming Vt=0 in order to simplify the explanation.

FIG. 20A is a diagram showing an example of a relationship between the frequency control voltage Vc and the adjustment frequency before and after the Vc sensitivity adjustment in the case of using a vibrator high in vibrator sensitivity, and FIG. 20B is a diagram showing an example of a relationship between the frequency control voltage Vc and the Vc sensitivity corresponding to FIG. 20A.

In the example shown in FIGS. 20A and 20B, the Vc sensitivity is adjusted by increasing the load capacitance so that the frequency varies in a range of −15 ppm through +15 ppm with respect to the nominal frequency when varying the frequency control voltage Vc in a range of ΔV centered on 0.9V. As shown in FIG. 20B, although the Vc sensitivities due to the variable capacitance elements on the input side and the output side of the amplifier element take peak values when the frequency control voltage Vc takes V1 and V2, respectively, the peak values after the adjustment are lowered compared to the peak values before the adjustment. Thus, it has been achieved to set the overall Vc sensitivity of the oscillator to a value around the target value of 50 ppm/V with respect to the variation range ΔV of the frequency control voltage Vc. As described above, according to the related art adjustment method, in the case of using the vibrator high in vibrator sensitivity, by increasing the load capacitance value by a value corresponding to the increment in the vibrator sensitivity, the Vc sensitivity can be adjusted to the target value.

Incidentally, the phase noise in an output signal of the voltage controlled oscillator (VCO) is calculated by an SSB phase noise reduction formula provided by Formula (4) below.

$$L(f_1) = 10\log\frac{1}{2}\left[\left\{\left(\frac{f_0}{2Q_L \cdot f_1}\right)^2 + 1\right\} \times \left(\frac{f_a}{f_1 + 1}\right) \times \frac{4FKT}{P_0}\right] \times \quad (4)$$

$$10\log\frac{1}{2}\cdot\frac{(V_{cnoise})^2(S_V)^2}{f_1^2}$$

In Formula (4), $f_0$ denotes a resonant frequency, $f_1$ denotes a mistuned frequency, $Q_L$ denotes a loaded Q, $f_\alpha$ denotes a corner frequency, F denotes a noise figure, K denotes the Boltzmann constant, T denotes ambient temperature, $P_0$ denotes an oscillation power, and $V_{cnoise}$ denotes the Vc noise.

According to Formula (4), assuming that the Vc noise (Vcnoise) is constant, the lower the Vc sensitivity (SV) is, the smaller the phase noise becomes. Therefore, there recently exists a purpose of using the oscillator adjusted to have a low Vc sensitivity in order to reduce the phase noise, and in some cases, adjustment to the low Vc sensitivity is required.

FIG. 21A is a diagram showing an example of the relationship between the frequency control voltage Vc and the adjustment frequency before and after the Vc sensitivity adjustment in the case of using the oscillator in the low Vc sensitivity, and FIG. 21B is a diagram showing an example of the relationship between the frequency control voltage Vc and the Vc sensitivity corresponding to FIG. 21A.

In the example shown in FIGS. 21A and 21B, before the adjustment, the Vc sensitivity is 50 ppm/V, and when varying the frequency control voltage Vc in a range of $\Delta V_A$ centered on 0.9V, the frequency varies in a range of −15 ppm through +15 ppm with respect to the nominal frequency. When adjusting the Vc sensitivity so as to drop to the target value of 40 ppm by increasing the load capacitance, after the adjustment, when varying the frequency control voltage Vc in a range of $\Delta V_B$ centered on 0.9V, the frequency varies in a range of −15 ppm through +15 ppm with respect to the nominal frequency. In other words, in the case of decreasing the Vc sensitivity, it is required to increase the variation range of the frequency control voltage Vc in order to keep the frequency adjustment range constant. As shown in FIG. 21B, although the Vc sensitivity can be kept at a value around the target value of 40 ppm/V in the vicinity of 0.9V, which is the center of the variation range $\Delta V_B$ of the frequency control voltage Vc, the drop of the Vc sensitivity on the low voltage side and the high voltage side is increased. As described above, according to the adjustment method of the related art, in the case of using the oscillator in the low Vc sensitivity, even if the Vc sensitivity is lowered by increasing the load capacitance value, it results that the Vc sensitivity is not constant in a desired range of the frequency control voltage Vc, but fluctuates. The variation of the Vc sensitivity becomes a factor for obstacle for a stable operation of the oscillator and characteristic degradation of C/N and so on.

Further, there are also the case in which the input/output amplitude voltage is different between the oscillators due to, for example, the difference in vibrator characteristics and the oscillation stage current, and the case in which the oscillator is used with the oscillation amplitude reduced in order to realize low power consumption of the oscillator, and it is required that the adjustment of the Vc sensitivity can accurately be performed irrespective of the level of the oscillation amplitude.

As shown in FIGS. 22A and 22B, the level of the oscillation amplitude affects the characteristics of the Vc sensitivity. FIG. 22A is a diagram showing an example of a relationship between an electrical potential difference between the both ends of the variable capacitance element when changing the oscillation amplitude and the capacitance, and FIG. 22B is a diagram showing an example of the relationship between the frequency control voltage Vc and the Vc sensitivity when changing the oscillation amplitude.

As shown in FIG. 22A, the smaller the oscillation amplitude is, the steeper the gradient of the capacitance variation of the variable capacitance element becomes, and as a result, as shown in FIG. 22B, the smaller the oscillation amplitude is, the higher the Vc sensitivity becomes, but the worse the linearity becomes.

FIG. 23A is a diagram showing an example of the relationship between the frequency control voltage Vc and the adjustment frequency before and after the Vc sensitivity adjustment in the case of using the oscillator in the small oscillation amplitude, and FIG. 23B is a diagram showing an example of the relationship between the frequency control voltage Vc and the Vc sensitivity corresponding to FIG. 23A.

In the example shown in FIGS. 23A and 23B, the adjustment is performed by increasing the load capacitance so that the frequency varies in a range of −15 ppm through +15 ppm with respect to the nominal frequency when varying the frequency control voltage in a range of $\Delta V$ centered on 0.9V. As shown in FIG. 23B, although it has been achieved that the Vc sensitivity is decreased to a value in the vicinity of the target value of 50 ppm/V with respect to the variation range $\Delta V$ of the frequency control voltage Vc, the linearity is not improved. As described above, according to the adjustment method of the related art, in the case in which the oscillation amplitude is small, even if the Vc sensitivity is lowered by increasing the load capacitance value, it results that the Vc sensitivity is not constant in a desired range of the frequency control voltage Vc, but fluctuates. The variation of the Vc sensitivity becomes a factor for obstacle for a stable operation of the oscillator and characteristic degradation of C/N and so on.

SUMMARY

An advantage of some aspects of the invention is to provide an oscillator circuit, vibratory device, an electronic apparatus, a moving object, a method of adjusting a vibratory device, and a sensitivity adjustment circuit each capable of performing the frequency control voltage sensitivity adjustment and the frequency control voltage sensitivity variation correction, which are higher in accuracy compared to the related art.

The invention can be implemented as the following forms or application examples.

Application Example 1

An oscillator circuit according to this application example includes an oscillatory device, a first control device adapted to control linearity of a frequency control voltage sensitivity of the oscillatory device based on a frequency control signal and configuration information, and a second control device adapted to control a level of the frequency control voltage sensitivity of the oscillatory device based on the configuration information.

The oscillator circuit according to this application example is capable to controlling the linearity of the frequency control voltage sensitivity of the oscillatory device with the first control device based on the configuration information, and controlling the level of the frequency control voltage sensitivity of the oscillatory device with the second control device based on the configuration information. Therefore, regarding the adjustment of the frequency control voltage sensitivity of the vibratory device including the oscillator circuit according to this application example, the adjustment higher in flexibility and accuracy becomes possible compared to the related art method of adjusting only the capacitance value of the load capacitance circuit.

Application Example 2

An oscillator circuit according to this application example is an oscillator circuit adapted to oscillate an resonator element at a frequency based on a frequency control signal, the oscillator circuit including a load capacitance circuit, and a first variable capacitance element, a capacitance value of which varies based on a first voltage applied to one end of the first variable capacitance element, and the frequency control signal applied to another end of the first variable capacitance element, wherein a capacitance value of the load capacitance circuit and the first voltage are controlled based on configuration information.

The configuration information can be stored in an internal storage section of the oscillator circuit, or input through the external terminal of the oscillator circuit.

The oscillator circuit according to this application example is capable of adjusting not only the capacitance value of the load capacitance circuit but also the first voltage to be applied to the one end of the first variable capacitance element in accordance with the configuration information. Therefore, regarding the adjustment of the frequency control voltage sensitivity of the vibratory device including the oscillator circuit according to this application example, the adjustment higher in flexibility and accuracy becomes possible compared to the related art method of adjusting only the capacitance value of the load capacitance circuit.

Application Example 3

The oscillator circuit according to the application example described above may be configured to further include a reference voltage adjustment circuit adapted to generate the first voltage based on the configuration information.

The oscillator circuit according to this application example includes the reference voltage adjustment circuit for adjusting not only the capacitance value of the load capacitance circuit but also the first voltage as a reference voltage to be applied to the one end of the first variable capacitance element in accordance with the configuration information. By making the reference voltage supplied to the variable capacitance element adjustable as described above, it becomes easy to make the frequency control voltage sensitivity in the desired range of the frequency control voltage constant. Thus, the frequency control voltage sensitivity adjustment and the frequency control voltage sensitivity variation correction higher in accuracy compared to the related art method becomes possible.

Application Example 4

The oscillator circuit according to the application example described above may be configured such that the capacitance value of the load capacitance circuit and the first voltage are controlled independently of each other based on the configuration information.

According to the oscillator circuit according to this application example, since the frequency control voltage adjustment of the vibratory device including the oscillator circuit according to this application example can more flexibly be performed, even in the case in which the use condition of the vibratory device is changed, the frequency control voltage sensitivity adjustment and the frequency control voltage sensitivity variation correction with high accuracy becomes possible.

Application Example 5

The oscillator circuit according to the application example described above may be configured such that the capacitance value of the load capacitance circuit and the first voltage are controlled in conjunction with each other based on the configuration information.

According to the oscillator circuit according to this application example, it becomes possible to arrange that the optimum frequency control voltage sensitivity characteristics can be obtained with respect to each of a plurality of predetermined use conditions of the vibratory device including the oscillator circuit according to this application example only by changing the setting value. Further, the number of bits of the configuration information can be reduced.

Application Example 6

The oscillator circuit according to the application example described above may be configured such that a second variable capacitance element, a capacitance value of which varies based on a second voltage applied to one end of the second variable capacitance element, and the frequency control signal applied to another end of the second variable capacitance element is further included, and the second voltage is controlled based on the configuration information.

According to the oscillator circuit according to this application example, it is possible to adjust not only the capacitance value of the load capacitance circuit, but also the first voltage to be applied to the one end of the first variable capacitance element and the second voltage to be applied to the one end of the second variable capacitance element. Therefore, regarding the adjustment of the frequency control voltage sensitivity of the vibratory device including the oscillator circuit according to this application example, the adjustment higher in flexibility and accuracy becomes possible compared to the related art method of adjusting only the capacitance value of the load capacitance circuit.

Application Example 7

The oscillator circuit according to the application example described above may be configured such that a reference voltage adjustment circuit adapted to generate the first voltage and the second voltage based on the configuration information is further included.

According to the oscillator circuit according to this application example, there is included the reference voltage adjustment circuit for adjusting not only the capacitance value of the load capacitance circuit, but also the first voltage, which is a reference voltage, to be applied to the one end of the first variable capacitance element and the second voltage, which is a reference voltage, to be applied to the one end of the second variable capacitance element in accordance with the configuration information. By making the reference voltages supplied to the two variable capacitance elements adjustable as described above, it becomes easy to make the frequency control voltage sensitivity in the desired range of the frequency control voltage constant. Thus, the frequency control voltage sensitivity adjustment and the frequency control voltage sensitivity variation correction higher in accuracy compared to the related art method becomes possible.

Application Example 8

The oscillator circuit according to the application example described above may be configured such that the capacitance value of the load capacitance circuit, the first voltage, and the second voltage are controlled independently of each other based on the configuration information.

According to the oscillator circuit according to this application example, since the frequency control voltage adjustment of the vibratory device including the oscillator circuit according to this application example can more flexibly be performed, even in the case in which the use condition of the vibratory device is changed, the frequency control voltage sensitivity adjustment and the frequency control voltage sensitivity variation correction with high accuracy becomes possible.

Application Example 9

The oscillator circuit according to the application example described above may be configured such that the capacitance value of the load capacitance circuit, the first voltage, and the second voltage are controlled in conjunction with each other based on the configuration information.

According to the oscillator circuit according to this application example, it becomes possible to arrange that the optimum frequency control voltage sensitivity characteristics can be obtained with respect to each of a plurality of predetermined use conditions of the vibratory device including the oscillator circuit according to this application example only by changing the setting value. Further, the number of bits of the configuration information can be reduced.

Application Example 10

A sensitivity adjustment circuit according to this application example includes a variable capacitance element, a capacitance value of which varies based on a first voltage applied to one end of the variable capacitance element, and a frequency control signal applied to another end of the variable capacitance element, and a load capacitance element, a frequency control voltage sensitivity of a vibratory device varying in frequency is adjusted by varying the capacitance value of the variable capacitance element, and a capacitance value of the load capacitance circuit and the first voltage are controlled based on configuration information.

The sensitivity adjustment circuit according to this application example is capable of adjusting not only the capacitance value of the load capacitance circuit but also the first voltage to be applied to the one end of the variable capacitance element in accordance with the configuration information. Therefore, regarding the adjustment of the frequency control voltage sensitivity of the vibratory device including the sensitivity adjustment circuit according to this application example, the adjustment higher in flexibility and accuracy becomes possible compared to the related art method of adjusting only the capacitance value of the load capacitance circuit.

Application Example 11

A vibratory device according to this application example includes any one of the oscillator circuits described above, and a resonator element oscillated by the oscillator circuit.

The vibratory device is, for example, an oscillator equipped with a vibrator as the resonator element or a physical quantity sensor equipped with a vibratory sensing element as the resonator element.

According to the vibratory device according to this application example, it becomes possible to arrange that the optimum frequency control voltage sensitivity characteristics can be obtained in accordance with a variety of use conditions.

Application Example 12

An electronic apparatus according to this application example includes any one of the oscillator circuits described above.

Application Example 13

A moving object according to this application example includes any one of the oscillator circuits described above.

Application Example 14

A method of adjusting a vibratory device according to this application example includes: providing the vibratory device including a resonator element, and an oscillator circuit having a load capacitance circuit, and a variable capacitance element, a capacitance value of which varies based on a first voltage applied to one end of the variable capacitance element, and a frequency control signal applied to another end of the variable capacitance element, and oscillating the resonator element at a frequency based on the frequency control signal, measuring a frequency of the vibratory device corresponding to each of at least three signal values of the frequency control signal, calculating frequency control voltage sensitivity of the vibratory device for each of the at least three signal values based on a measurement result of the measuring of a frequency, and adjusting at least one of a capacitance value of the load capacitance circuit and the first voltage based on a calculation result obtained in the calculating of frequency control voltage sensitivity so that frequency control voltage sensitivity of the vibratory device is included in a allowable range.

According to the method of adjusting the vibratory device according to this application example, since it is arranged that the frequency control voltage sensitivity is included in the allowable range by adjusting at least one of the capacitance value of the load capacitance circuit and the first voltage to be applied to the one end of the variable capacitance element using the frequency control voltage sensitivity calculated with respect to the three or more signal values of the frequency control signal, the adjustment higher in flexibility and accuracy compared to the related art method becomes possible.

BRIEF DESCRIPTION OF THE DRAWINGS

The invention will now be described with reference to the accompanying drawings, wherein like numbers reference like elements.

FIGS. 8A through 8F are explanatory diagrams of a method of correcting a reference voltage and a load capacitance in the Vc sensitivity adjustment.

FIGS. 9A through 9F are explanatory diagrams of the method of correcting the reference voltage and the load capacitance in the Vc sensitivity adjustment.

FIG. 11 is a diagram showing an example of setting a mode of the Vc sensitivity adjustment in the oscillator circuit according to the second embodiment.

FIGS. 12A and 12B are diagrams each showing a configuration example of the vibratory device.

DESCRIPTION OF EXEMPLARY EMBODIMENTS

Hereinafter, some preferred embodiments of the invention will be described in detail with reference to the accompanying drawings. It should be noted that the embodiments described below do not unreasonably limit the content of the invention as set forth in the appended claims. Further, it is not necessarily true that all of the constituents described below are essential elements of the invention.

1. OSCILLATOR CIRCUIT

1-1. Outline

Figure 1:
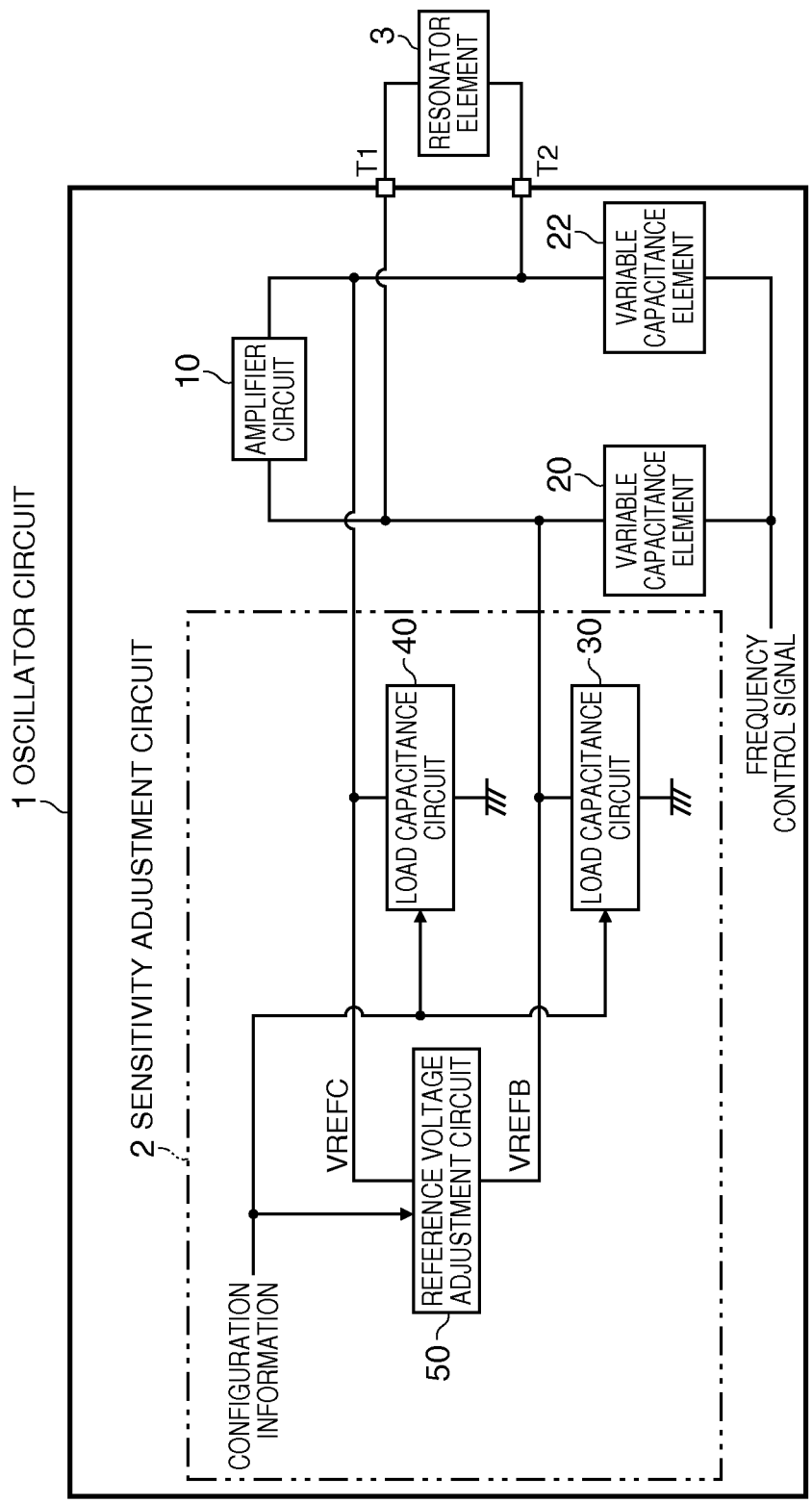
FIG. 1 is a schematic functional block diagram of an oscillator circuit according to an embodiment of the invention.

FIG. 1 is a functional block diagram schematically showing an oscillator circuit according to the present embodiment. As shown in FIG. 1, the oscillator circuit 1 according to the present embodiment is a voltage controlled oscillator circuit including a terminal T1 (a first terminal), a terminal T2 (a second terminal), an amplifier circuit 10, a variable capacitance element 20 (a first variable capacitance element), a variable capacitance element 22 (a second variable capacitance element), a load capacitance circuit 30 (a first load capacitance circuit), a load capacitance circuit 40 (a second load capacitance circuit), and a reference voltage adjustment circuit 50. It should be noted that the oscillator circuit 1 according to the present embodiment can have a configuration obtained by eliminating or modifying some of these constituents, or adding another constituent.

A resonator element 3 is connected between the terminal T1 and the terminal T2 of the oscillator circuit 1.

As the resonator element 3, there can be used, for example, a surface acoustic wave (SAW) resonator, an AT-cut crystal vibrator, an SC-cut crystal vibrator, a tuning-fork crystal vibrator, other piezoelectric vibrators, and a Micro Electro Mechanical Systems (MEMS) vibrator. As a substrate material of the resonator element 3, there can be used, for example, a piezoelectric single crystal such as a quartz crystal, lithium tantalate, or lithium niobate, a piezoelectric material such as piezoelectric ceramics including, for example, lead zirconate titanate, or a silicon semiconductor material. As an excitation device of the resonator element 3, there can be used a device using a piezoelectric effect, or electrostatic drive using a coulomb force.

The amplifier circuit 10 is connected between the terminal T1 and the terminal T2 so that the input terminal is located on the terminal T1 side, and the output terminal is located on the terminal T2 side. It is also possible to dispose a capacitance element for cutting a DC component between the input terminal of the amplifier circuit 10 and the terminal T1, and between the output terminal of the amplifier circuit 10 and the terminal T2, if necessary.

As an amplifier element provided to the amplifier circuit 10, a bipolar transistor, a field effect transistor (FET), a metal oxide semiconductor field effect transistor (MOSFET), a thyristor, and so on can be used.

The reference voltage adjustment circuit 50 generates a reference voltage VREFB (a first voltage) on the input side of the amplifier circuit 10, and a reference voltage VREFC (a second voltage) on the output side of the amplifier circuit 10, and then supplies the terminal T1 with the reference voltage VREFB and supplies the terminal T2 with the reference voltage VREFC.

The variable capacitance element 20 is connected to the terminal T1 in one end, and varies in capacitance value in accordance with a frequency control signal input to the other end. The variable capacitance element 22 is connected to the terminal T2 in one end, and varies in capacitance value in accordance with the frequency control signal input to the other end. As the frequency control signal, an automatic frequency control (AFC) voltage, a temperature compensation voltage, and a frequency offset voltage can be used. It should be noted that the variation of each of the capacitance values of the variable capacitance element 20 and the variable capacitance element 22 takes the maximum value when the electrical potential difference between the both ends is equal to a certain electrical potential difference Vt, Vt=0 is assumed in the following explanation in order to simplify the explanation.

As the variable capacitance element 20 and the variable capacitance element 22, a varactor (also called a variable capacitance diode) and so on can be used.

The load capacitance circuit 30 is connected between the terminal T1 and the ground, and the load capacitance circuit 40 is connected between the terminal T2 and the ground.

Further, the oscillator circuit 1 according to the present embodiment is configured so that the capacitance value of the load capacitance circuit 30, the capacitance value of the load capacitance circuit 40, VREFB (the electrical potential of the terminal T1), and VREFC (the electrical potential of the terminal T2) can be adjusted in accordance with configuration information. Specifically, the load capacitance circuit 30 and the load capacitance circuit 40 are set to the capacitance values corresponding to the configuration information (e.g., Bit setting values), and the reference voltage adjustment circuit 50 generates VREFB and VREFC having the electrical potential differences corresponding to the configuration information. The configuration information can be stored in an internal memory (not shown in FIG. 1) of the oscillator circuit 1, or can be input from the outside of the oscillator circuit 1 via a terminal.

According to the oscillator circuit 1 having such a configuration, as explained below, the overall frequency control voltage sensitivity (the Vc sensitivity) (defined as a variation of the frequency to the variation of the voltage (the frequency control voltage Vc) of the frequency control signal) of the oscillator (a vibratory device in abroad sense) including the oscillator circuit 1 and the resonator element 3 can more accurately be adjusted than in the related art.

Figure 20A:
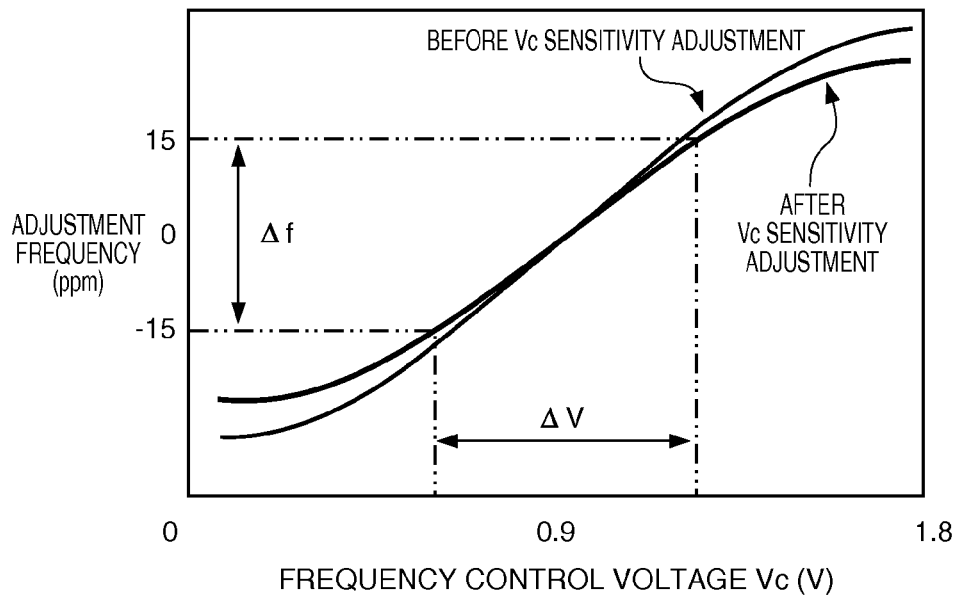
FIGS. 20A and 20B are explanatory diagrams of the Vc sensitivity adjustment of the related art in the case of using a vibrator high in vibrator sensitivity.
Figure 20B:
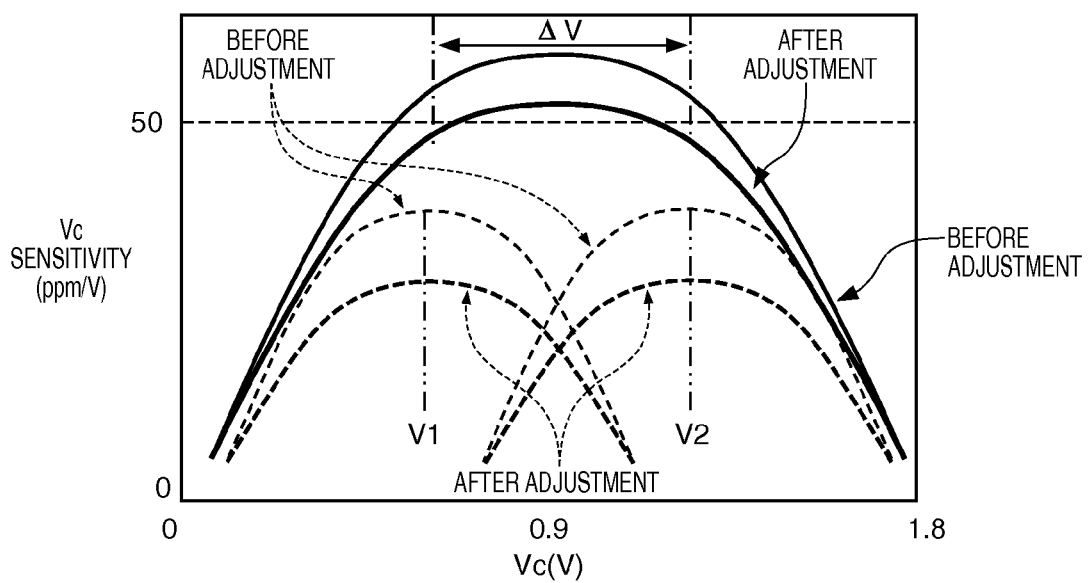
Figure 21A:
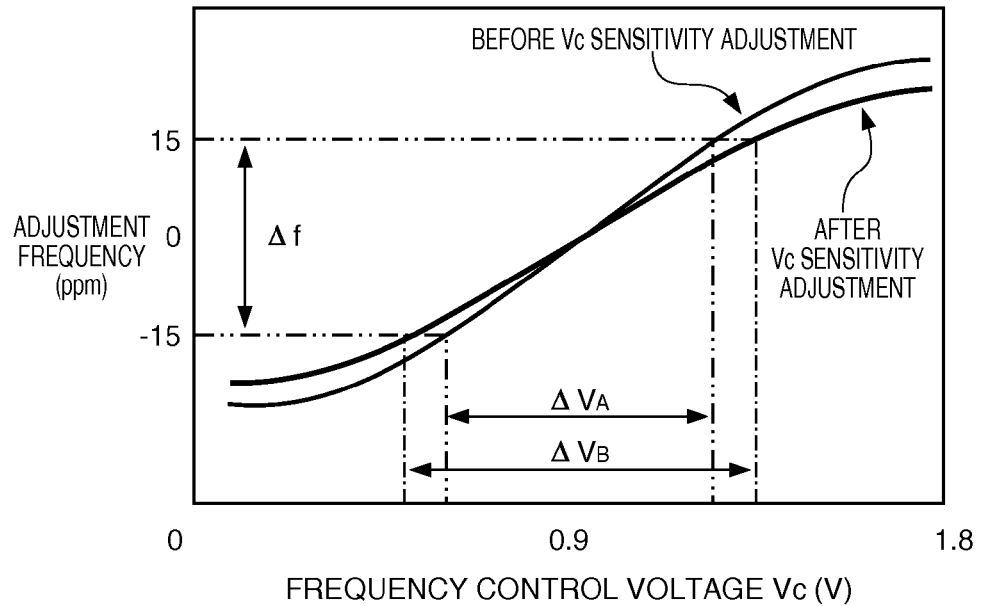
FIGS. 21A and 21B are explanatory diagrams of the Vc sensitivity adjustment of the related art in the case of using the oscillator in low Vc sensitivity.
Figure 21B:
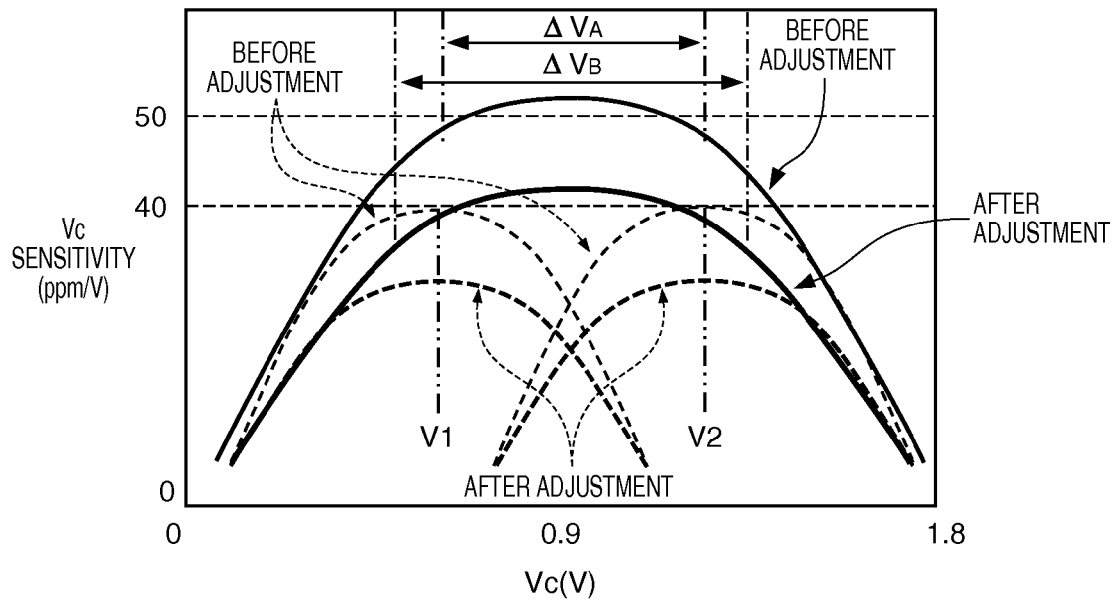
Figure 22A:
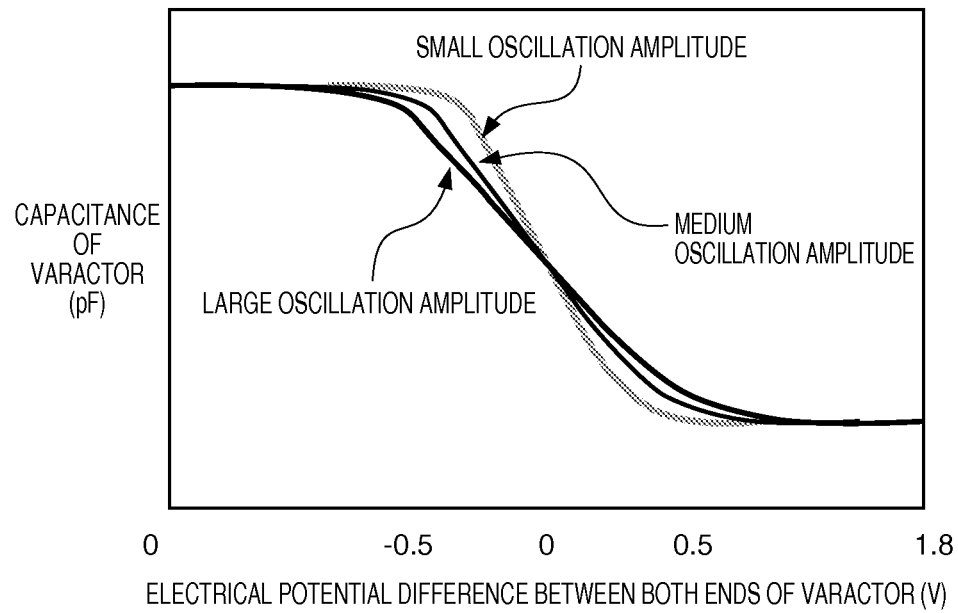
FIGS. 22A and 22B are explanatory diagrams of the relationship between the oscillation amplitude of the oscillator and the Vc sensitivity.
Figure 22B:
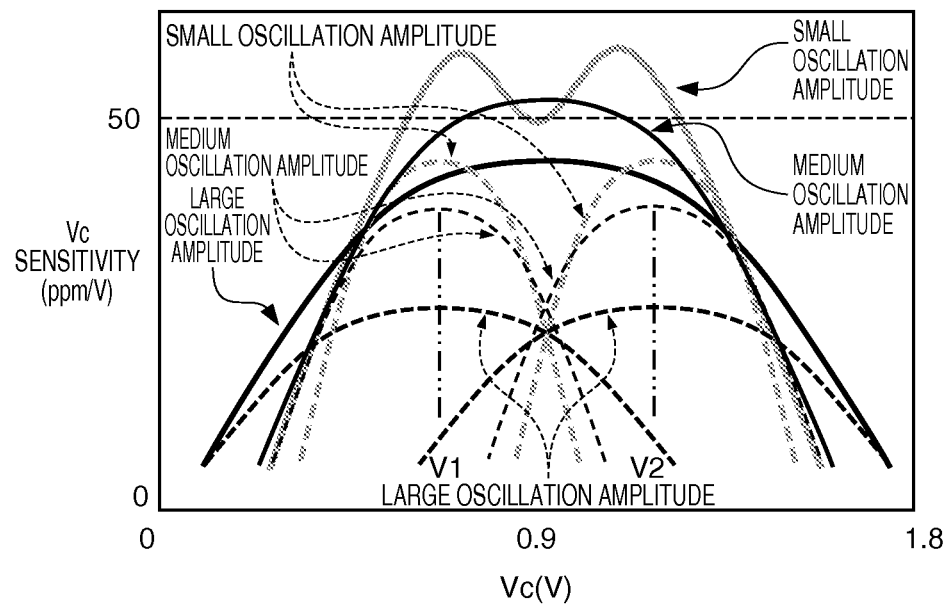
Figure 23A:
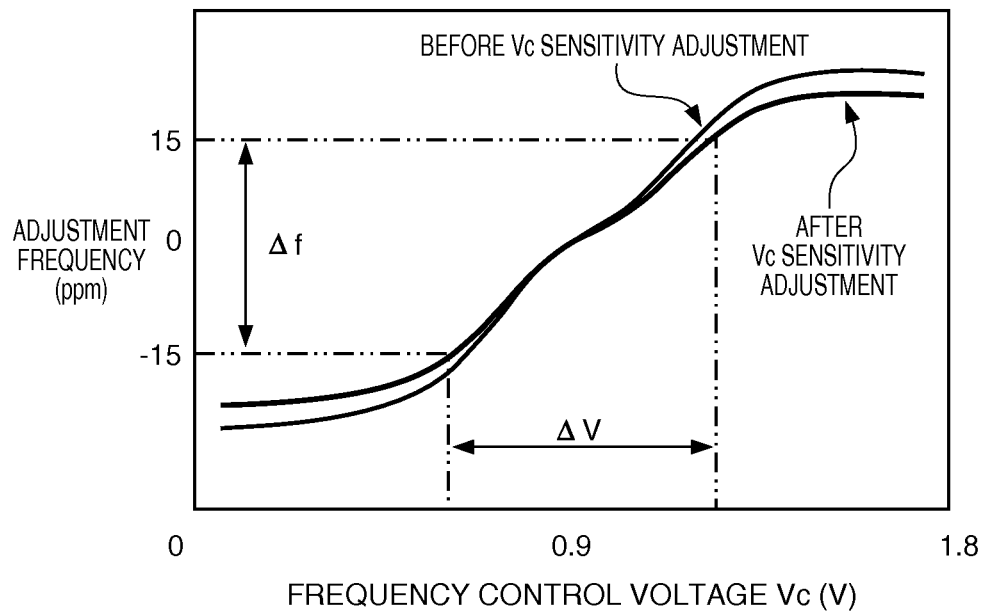
FIGS. 23A and 23B are explanatory diagrams of the Vc sensitivity adjustment of the related art in the case of using the oscillator in a small oscillation amplitude.
Figure 23B:
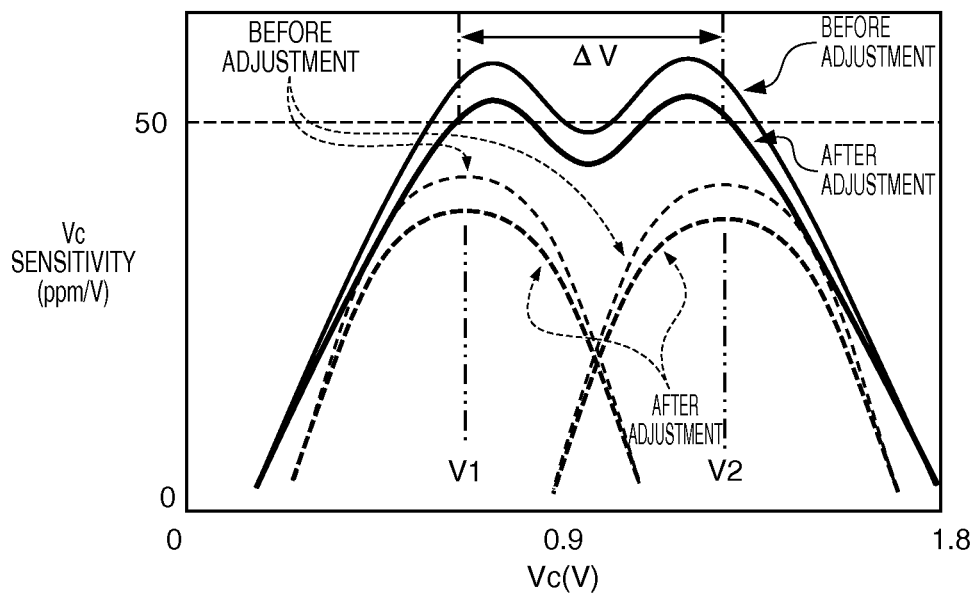

Firstly, in the case of using the vibrator high in vibrator sensitivity, by increasing both of the capacitance value of the load capacitance circuit 30 and the capacitance value of the load capacitance circuit 40, it has been achieved that the overall Vc sensitivity of the oscillator can be set to the value in the vicinity of the target value with respect to the variation range of the frequency control voltage Vc similarly to the related art method explained with reference to FIGS. 20A and 20B.

Figure 2A:
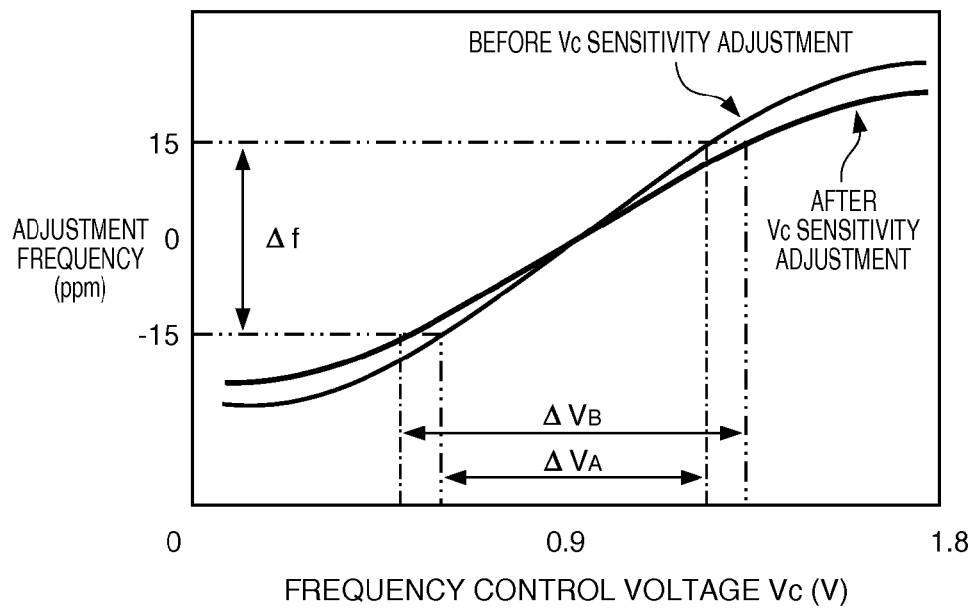
FIGS. 2A and 2B are explanatory diagrams of a Vc sensitivity adjustment in the case of using an oscillator in low Vc sensitivity.

Then, an example of the adjustment method in the case of using the oscillator in low Vc sensitivity will be explained. FIG. 2A is a diagram showing an example of the relationship between the frequency control voltage Vc and the adjustment frequency before and after the Vc sensitivity adjustment in the case of using the oscillator in the low Vc sensitivity, and FIG. 2B is a diagram showing an example of the relationship between the frequency control voltage Vc and the Vc sensitivity corresponding to FIG. 2A.

Figure 2B:
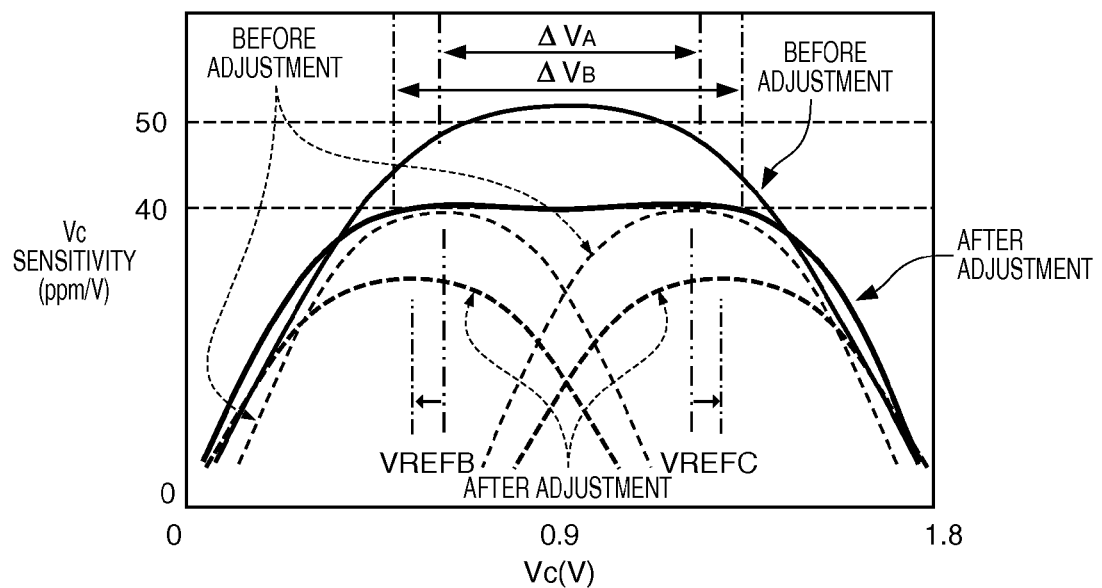

In the example shown in FIGS. 2A and 2B, before the adjustment, the Vc sensitivity is 50 ppm/V, and when varying the frequency control voltage Vc in a range of $\Delta V_A$ centered on 0.9V, the frequency varies in a range of −15 ppm through +15 ppm with respect to the nominal frequency. When adjusting the Vc sensitivity so as to drop to the target value of 40 ppm, after the adjustment, when varying the frequency control voltage Vc in a range of $\Delta V_B$ centered on 0.9V, the frequency varies in a range of −15 ppm through +15 ppm with respect to the nominal frequency.

In the present embodiment, for example, the adjustment is performed so as to increase both of the capacitance value of the load capacitance circuit 30 and the capacitance value of the load capacitance circuit 40, lower the VREFB, and raise the VREFC. As shown in FIG. 2B, by increasing the capacitance value of the load capacitance circuit 30, the proportion of the capacitance value of the variable capacitance element 20 in the oscillator load capacitance $C_L$ is reduced, and therefore, the peak value of the Vc sensitivity due to the variable capacitance element 20 drops. Further, by lowering the VREFB, the peak value of the Vc sensitivity due to the variable capacitance element 20 moves toward the low voltage side. Similarly, by increasing the capacitance value of the load capacitance circuit 40, the proportion of the capacitance value of the variable capacitance element 22 in the oscillator load capacitance $C_L$ is reduced, and therefore, the peak value of the Vc sensitivity due to the variable capacitance element 22 drops. Further, by raising the VREFC, the peak value of the Vc sensitivity due to the variable capacitance element 22 moves toward the high voltage side.

Due to such an adjustment as described above, the overall Vc sensitivity of the oscillator obtained by combining the Vc sensitivity due to the variable capacitance element 20 and the Vc sensitivity due to the variable capacitance element 30 can be decreased to a level in the vicinity of the target value of 40 ppm/V, and at the same time, can be made roughly flat with respect to the variation range $\Delta V_B$ of the frequency control voltage Vc.

Figure 3A:
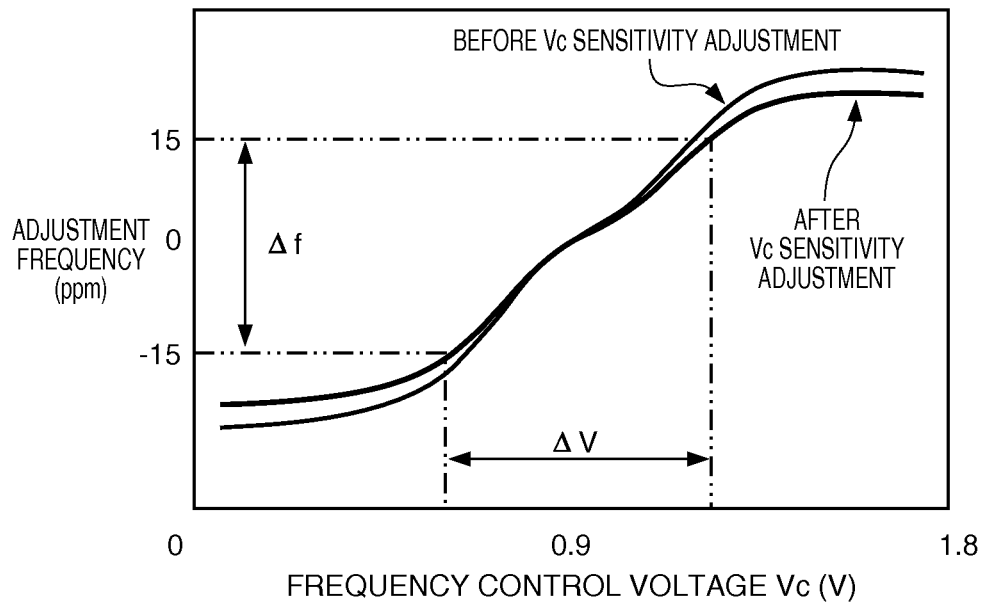
FIGS. 3A and 3B are explanatory diagrams of the Vc sensitivity adjustment in the case of using the oscillator in a small oscillation amplitude.

Then, an example of the adjustment method in the case of using the oscillator in a small oscillation amplitude will be explained. FIG. 3A is a diagram showing an example of the relationship between the frequency control voltage Vc and the adjustment frequency before and after the Vc sensitivity adjustment in the case of using the oscillator in the small oscillation amplitude, and FIG. 3B is a diagram showing an example of the relationship between the frequency control voltage Vc and the Vc sensitivity corresponding to FIG. 3A.

Figure 3B:
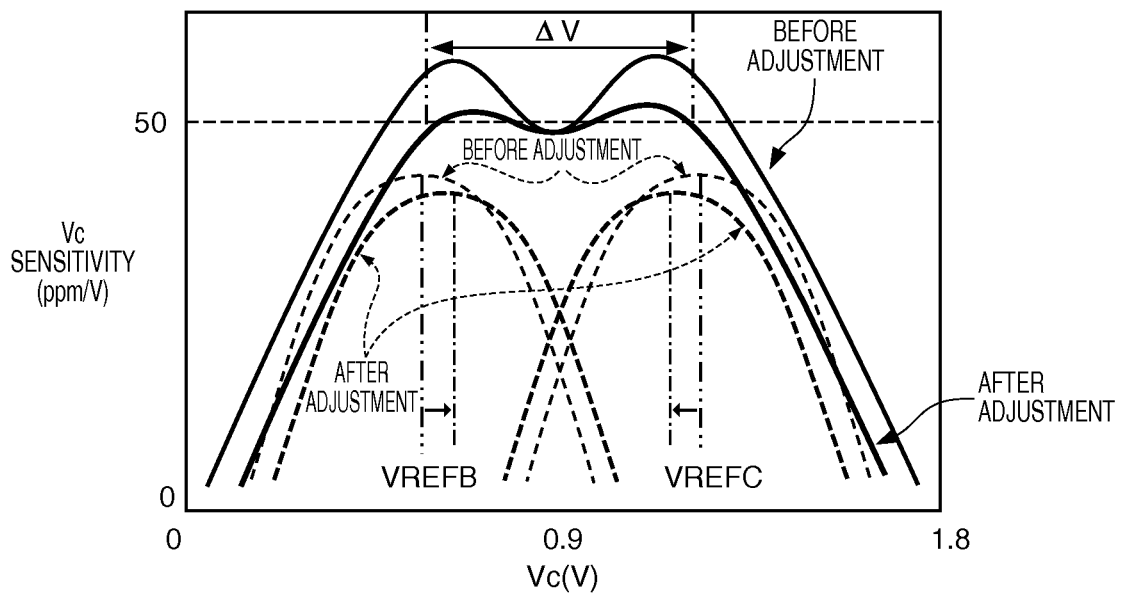

In the example shown in FIGS. 3A and 3B, the adjustment is performed so that the frequency varies in a range of −15 ppm through +15 ppm with respect to the nominal frequency when varying the frequency control voltage in a range of $\Delta V$ centered on 0.9V.

In the present embodiment, for example, the adjustment is performed so as to increase both of the capacitance value of the load capacitance circuit 30 and the capacitance value of the load capacitance circuit 40, raise the VREFB, and lower the VREFC. As shown in FIG. 3B, by increasing the capacitance value of the load capacitance circuit 30, the peak value of the Vc sensitivity due to the variable capacitance element 20 drops, and by raising VREFB, the peak value of the Vc sensitivity due to the variable capacitance element 20 moves toward the high voltage side. Similarly, by increasing the capacitance value of the load capacitance circuit 40, the peak value of the Vc sensitivity due to the variable capacitance element 30 drops, and by lowering VREFC, the peak value of the Vc sensitivity due to the variable capacitance element 30 moves toward the low voltage side.

Due to such an adjustment as described above, the overall Vc sensitivity of the oscillator obtained by combining the Vc sensitivity due to the variable capacitance element 20 and the Vc sensitivity due to the variable capacitance element 30 can be decreased to a level in the vicinity of the target value of 50 ppm/V, and at the same time, the linearity can be improved with respect to the variation range $\Delta V_B$ of the frequency control voltage Vc.

As described above, in the present embodiment, the circuit including the load capacitance circuit 30, the load capacitance circuit 40, and the reference voltage adjustment circuit 50 functions as a sensitivity adjustment circuit 2 capable of adjusting the Vc sensitivity of the oscillator including the oscillator circuit 1 and the resonator element 3 with high accuracy.

Then, more specific embodiments of the oscillator circuit 1 will be explained in detail.

1-2. First Embodiment

Configuration

Figure 4:
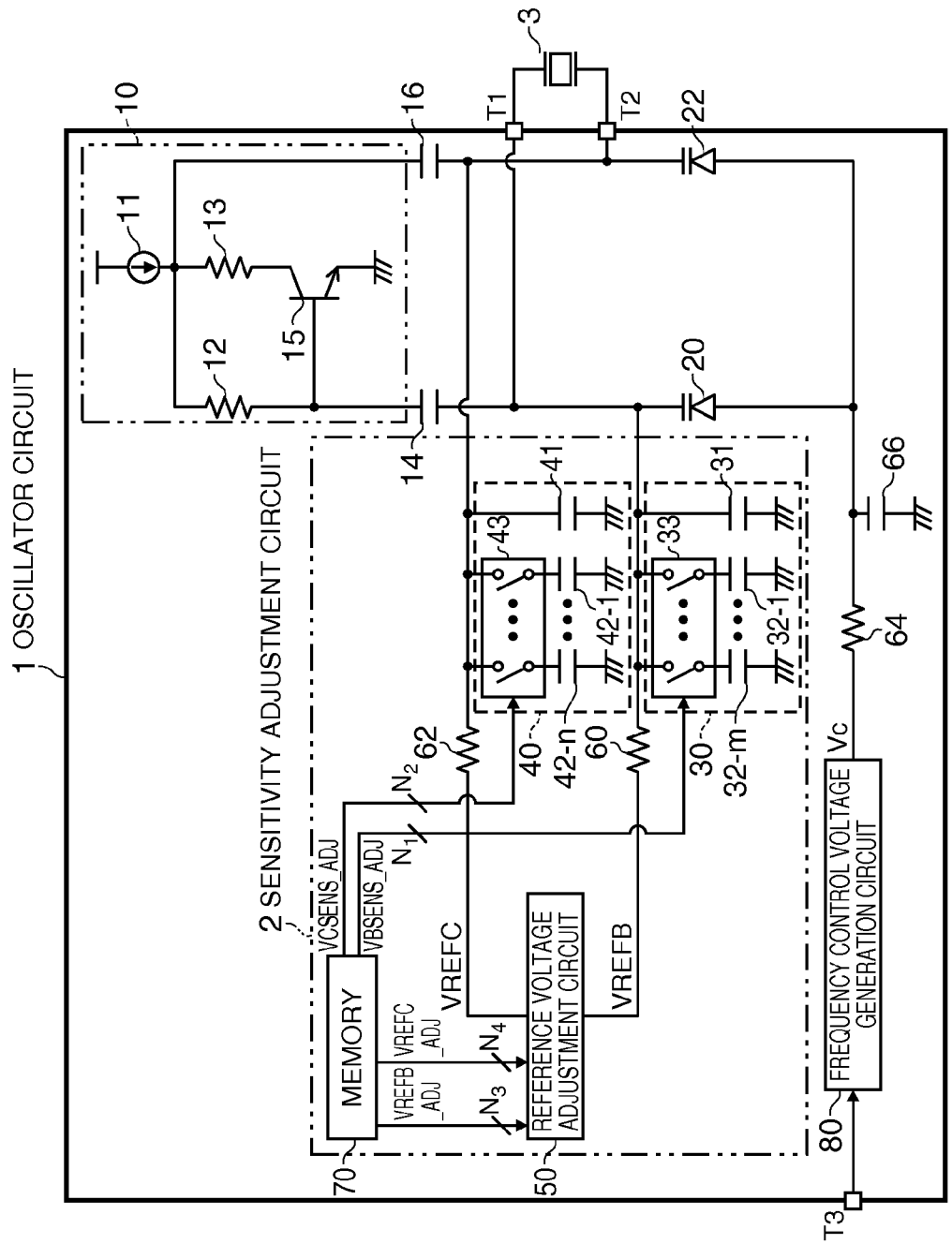
FIG. 4 is a diagram showing a configuration example of an oscillator circuit according to a first embodiment of the invention.

FIG. 4 is a diagram showing a configuration example of an oscillator circuit according to a first embodiment. In FIG. 4, the constituents corresponding to the constituents shown in FIG. 1 are denoted with the same reference symbols as in FIG. 1.

As shown in FIG. 4, the oscillator circuit 1 according to the first embodiment includes the amplifier circuit 10, capacitors 14, 16, the variable capacitance elements 20, 22, the load capacitance circuit 30, the load capacitance circuit 40, the reference voltage adjustment circuit 50, resistors 60, 62, 64, a capacitor 66, a memory 70, and a frequency control voltage generation circuit 80. It should be noted that the oscillator circuit 1 according to the present embodiment can have a configuration obtained by eliminating or modifying some of these constituents, or adding another constituent.

The resonator element 3 is connected between the terminal T1 and the terminal T2 of the oscillator circuit 1. In the present embodiment, the resonator element 3 is a quartz crystal vibrator.

The amplifier circuit 10 is configured including a current source circuit 11, two resistors 12, 13, and an amplifier element 15. The amplifier element 15 is a bipolar transistor, and has a base terminal connected to the terminal T1 via the DC cutting capacitor 14, a collector terminal connected to the terminal T2 via the resistor 13 and the DC cutting capacitor 16, and an emitter terminal grounded. Further, the resistor 12 is connected between the base terminal of the amplifier element 15 and the resistor 13, and the amplifier element 15 is supplied with a current from the current source circuit 11. It should be noted that it is possible to configure the amplifier circuit 10 using a CMOS inverter as the amplifier element. The amplifier circuit 10 can be configured by, for example, connecting an input terminal of the CMOS inverter to the terminal T1 via the DC cutting capacitor 14, connecting an output terminal of the CMOS inverter to the terminal T2 via the DC cutting capacitor 16, and connecting a feedback resistor between the output terminal and the input terminal of the CMOC inverter.

The reference voltage adjustment circuit 50 generates the reference voltage VREFB and the reference voltage VREFC higher than VREFB, supplies the reference voltage VREFB to the terminal T1 via the resistor 60, and at the same time, supplies the reference voltage VREFC to the terminal T2 via the resistor 62.

The variable capacitance element 20 is a varactor, and the cathode terminal is connected to the terminal T1, and the reference voltage VREFB is applied to the cathode terminal. Similarly, the variable capacitance element 22 is a varactor, and the cathode terminal is connected to the terminal T2, and the reference voltage VREFC is applied to the cathode terminal.

The frequency control voltage generation circuit 80 generates the frequency control voltage Vc with a voltage value corresponding a signal input from the terminal T3. The frequency control voltage Vc, from which high-frequency noise is removed (reduced, to be precise) via a low-pass filter composed of the resistor 64 and the capacitor 66, is input to the anode terminal of the variable capacitance element 20 and the anode terminal of the variable capacitance element 22.

Therefore, the variable capacitance element 20 varies in capacitance value in accordance with the electrical potential difference between the frequency control voltage Vc and the reference voltage VREFB, and the variable capacitance element 22 varies in capacitance value in accordance with the electrical potential difference between the frequency control voltage Vc and the reference voltage VREFC. In other words, the oscillator circuit 1 according to the present embodiment is a voltage-controlled crystal oscillator circuit having an oscillatory frequency varying in accordance with the signal input from the terminal T3.

The memory 70 is a rewritable nonvolatile memory, and can be realized by, for example, an electrically erasable programmable read-only memory (EEPROM) or the like. In the present embodiment, the memory 70 is arranged to be able to store four types of adjustment values (corresponding to the configuration information shown in FIG. 1). An adjustment value VBSENS_ADJ represented in $N_1$ bits is used for adjusting the capacitance value of the load capacitance circuit 30. An adjustment value VCSENS_ADJ represented in $N_2$ bits is used for adjusting the capacitance value of the load capacitance circuit 40. An adjustment value VREFB_ADJ represented in $N_3$ bits is used for adjusting the reference voltage VREFB. An adjustment value VREFC_ADJ represented in $N_4$ bits is used for adjusting the reference voltage VREFC.

The load capacitance circuit 30 is configured as a capacitance bank including a plurality of capacitors 31, and 32-1 through 32-$m$ ($m \geq 1$), and a switch circuit 33. The switch circuit 33 is composed of m switch elements for respectively establishing or breaking the connection between the capacitors 32-1 through 32-$m$ and the terminal T1, and the each of the switching elements turns ON or OFF in accordance with the adjustment value VBSENS_ADJ. Further, the capacitors connected to the terminal T1 in accordance with the adjustment value VBSENS_ADJ correspond to the load capacitance on the output side (the input side of the amplifier circuit 10) of the resonator element 3. On the other hand, the capacitor 31 is connected to the terminal T1, and always acts as the load capacitance on the output side (the input side of the amplifier circuit 10) of the resonator element 3.

Similarly, the load capacitance circuit 40 is configured as a capacitance bank including a plurality of capacitors 41, and 42-1 through 42-$n$ ($n \geq 1$), and a switch circuit 43. The switch circuit 43 is composed of n switch elements for respectively establishing or breaking the connection between the capacitors 42-1 through 42-$n$ and the terminal T2, and the each of the switching elements turns ON or OFF in accordance with the adjustment value VCSENS_ADJ. Further, the capacitors connected to the terminal T2 in accordance with the adjustment value VCSENS_ADJ correspond to the load capacitance on the input side (the output side of the amplifier circuit 10) of the resonator element 3. On the other hand, the capacitor 41 is connected to the terminal T2, and always acts as the load capacitance on the input side (the output side of the amplifier circuit 10) of the resonator element 3.

The reference voltage adjustment circuit 50 generates the reference voltage VREFB at an electrical potential corresponding to the adjustment value VREFB_ADJ, and at the same time generates the reference voltage VREFC at an electrical potential corresponding to the adjustment value VREFC_ADJ.

In the present embodiment, the capacitance value of the load capacitance circuit 30, the capacitance value of the load capacitance circuit 40, the reference voltage VREFB, and the reference voltage VREFC can be individually adjusted in accordance with the adjustment values VBSENS_ADJ, VCSENS_ADJ, VREFB_ADJ, and VREFC_ADJ, respectively, and as described later, by individually adjusting these values, it becomes possible to accurately adjust the Vc sensitivity of the oscillator including the oscillator circuit 1 and the resonator element 3. In other words, the circuit including the load capacitance circuit 30, the load capacitance circuit 40, the reference voltage adjustment circuit 50, and the memory 70 functions as the sensitivity adjustment circuit 2 capable of adjusting the Vc sensitivity of the oscillator with high accuracy.

It should be noted that the oscillator circuit 1 can entirely or partially realized as an integrated circuit (IC) using a CMOS process or the like. For example, the oscillator circuit 1 can also be divided into the sensitivity adjustment circuit 2 and the other circuit, and realized with two respective IC chips. In this case, it is possible to include some other constituents of the oscillator circuit 1 such as the variable capacitance element 20 and the variable capacitance element 22 in the IC chip of the sensitivity adjustment circuit 2.

Further, the oscillator circuit 1 can also be configured by combining discrete components corresponding respectively to the constituents.

Vc Sensitivity Adjustment Method

Figure 5:
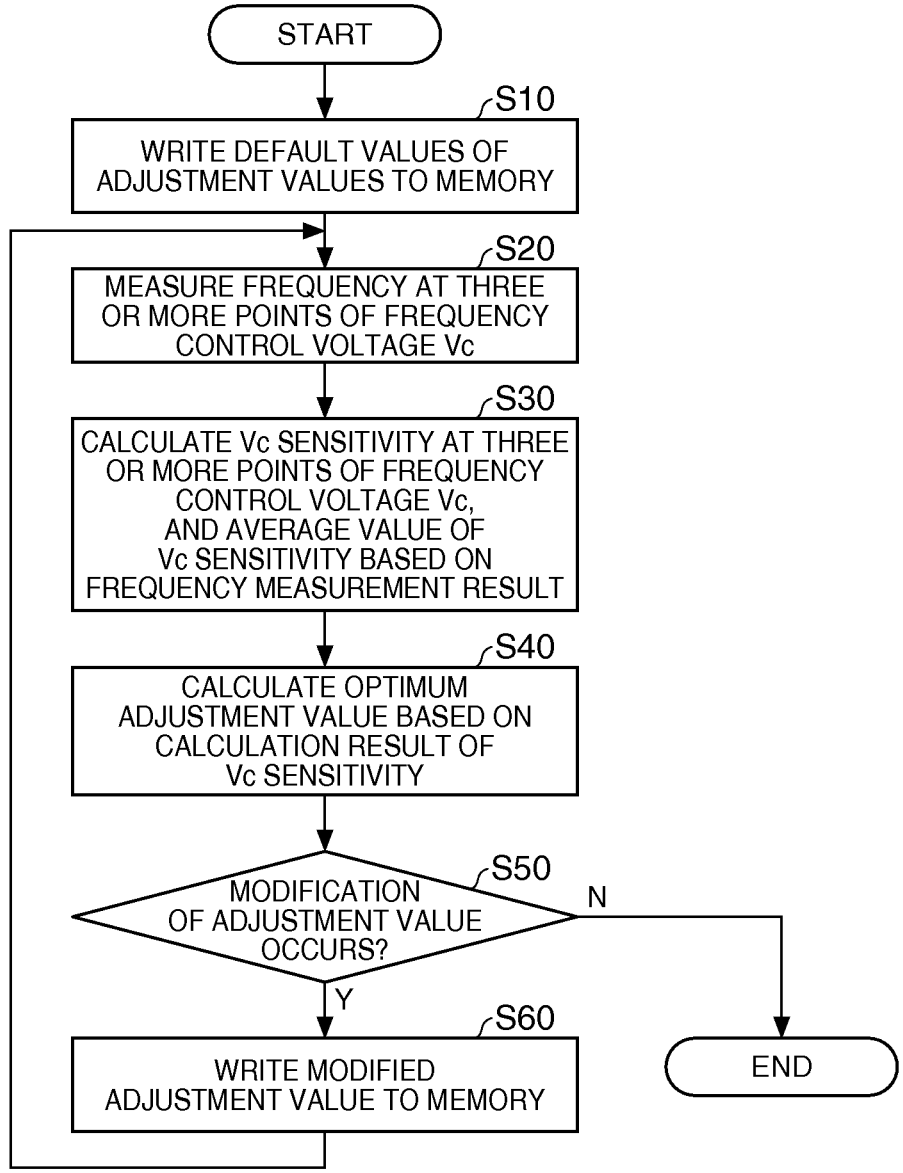
FIG. 5 is a flowchart showing an example of a method of adjusting the Vc sensitivity in the first embodiment.

Then, a method of adjusting the Vc sensitivity of the oscillator using the oscillator circuit 1 according to the present embodiment will be explained. FIG. 5 is a flowchart showing an example of the method of adjusting the Vc sensitivity in the present embodiment.

As shown in FIG. 5, default values of the adjustment values VBSENS_ADJ, VCSENS_ADJ, VREFB_ADJ, and VREFC_ADJ are first written (S10) to the memory.

Subsequently, the frequency of the oscillator is measured (S20) at three or more points of the frequency control voltage Vc.

Figure 6A:
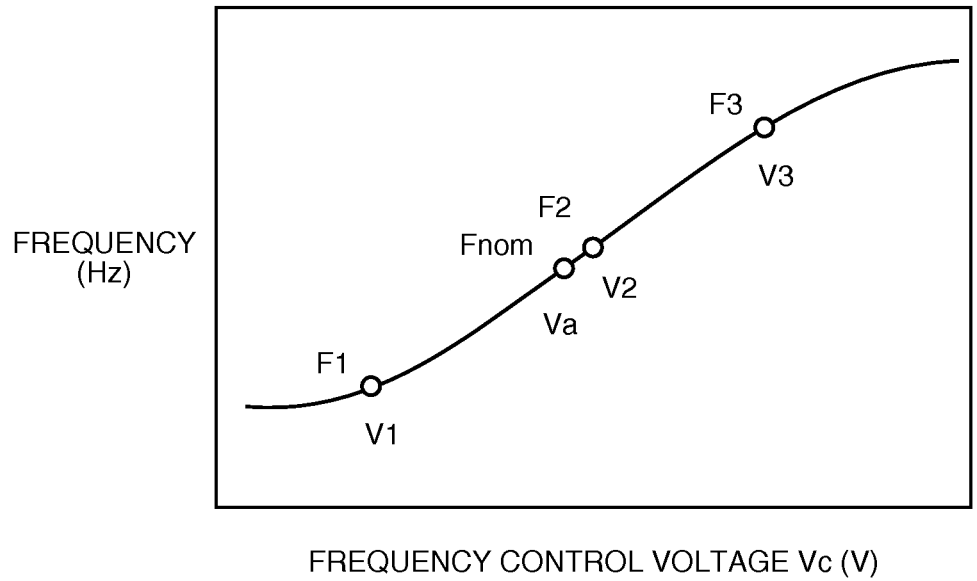
FIGS. 6A and 6B are explanatory diagrams of measurement of the frequency of the oscillator.

For example, it is also possible to measure the frequency of the oscillator at three points, namely a voltage value V1 sufficiently lower than the voltage value Va of the frequency control voltage Vc at which the nominal frequency (or the frequency after the frequency adjustment) Fnom is obtained, a voltage value V2 slightly higher than Va, and a voltage value V3 sufficiently higher than Va as shown in FIG. 6A.

Figure 6B:
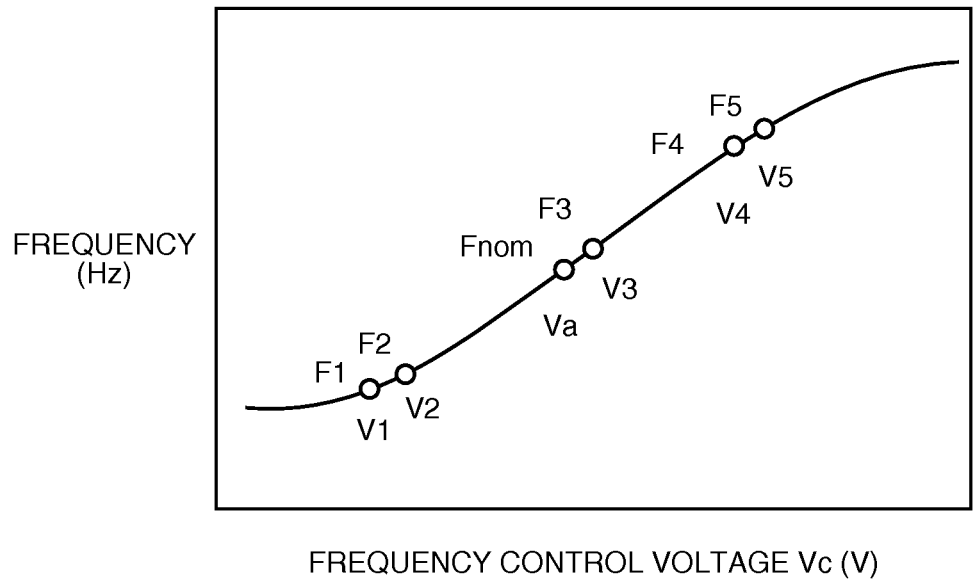

Further, for example, it is also possible to measure the frequency of the oscillator at five points, namely two voltage values V1, V2 sufficiently lower than the voltage value Va of the frequency control voltage Vc at which the nominal frequency (or the frequency after the frequency adjustment) Fnom is obtained, a voltage value V3 slightly higher than Va, and two voltage values V4, V5 sufficiently higher than Va as shown in FIG. 6B.

Subsequently, the Vc sensitivity at each of the three or more points of the frequency control voltage Vc and an average value of the Vc sensitivity are calculated (S30) based on the measurement result of the frequency in the step S20.

For example, in the example shown in FIG. 6A, approximate calculation of Vc sensitivity values S1, S2, and S3 at respective voltage values (Va+V1)/2, (V2+Va)/2, and (V3+V2)/2, and an average value Sa of the Vc sensitivity can be performed using Formulas (5) through (8) below based on measurement values F1, F2, and F3 of the frequency at the voltage values V1, V2, and V3, and the nominal frequency (or the frequency after the frequency adjustment) Fnom.

$$S1 = \frac{Fnom - F1}{Fnom \times (Va - V1)} \times 1E^6 (ppm/V) \quad (5)$$

$$S2 = \frac{F2 - Fnom}{Fnom \times (V2 - Va)} \times 1E^6 (ppm/V) \quad (6)$$

$$S3 = \frac{F3 - F2}{Fnom \times (V3 - V2)} \times 1E^6 (ppm/V) \quad (7)$$

$$Sa = \frac{S1 + S2 + S3}{3} (ppm/V) \quad (8)$$

Further, for example, in the example shown in FIG. 6B, approximate calculation of the Vc sensitivity values S1, S2, and S3 at the respective voltage values (V2+V1)/2, (V3+Va)/2, and (V5+V4)/2 can be performed using Formulas (9) through (11) below based on the measurement values F1, F2, F3, F4, and F5 of the frequency at the voltage values V1, V2, V3, V4, and V5, and the nominal frequency (or the frequency after the frequency adjustment) Fnom. Further, approximate calculation of the average value Sa of the Vc sensitivity can be performed using Formula (8) described above.

$$S1 = \frac{F2 - F1}{Fnom \times (V2 - V1)} \times 1E^6 (ppm/V) \quad (9)$$

$$S2 = \frac{F3 - Fnom}{Fnom \times (V3 - Va)} \times 1E^6 (ppm/V) \quad (10)$$

$$S3 = \frac{F5 - F4}{Fnom \times (V5 - V4)} \times 1E^6 (ppm/V) \quad (11)$$

Subsequently, an optimum adjustment value is calculated (S40) based on the calculation result of the Vc sensitivity in the step S30. The details of the calculation method in the step S40 will be described later.

Then, if modification of the adjustment value is necessary (Y in S50), the adjustment value (the adjustment value of the calculation result in S40 after the modification is written (S60) to the memory 70, and then the process of the step S20 and the following steps is performed. In contrast, if the modification of the adjustment value is unnecessary (N in S50), the adjustment of the Vc sensitivity is terminated.

Regarding the determination whether or not the modification of the adjustment value in the step S50 is necessary, it is possible to, for example, compare each of the adjustment values of the calculation result in the step S40 and the present adjustment value having been written in the memory with each other, and then determine that the modification is necessary if there is a difference, or determine that the modification is unnecessary if no difference exists.

The Vc sensitivity adjustment along the flowchart shown in FIG. 5 is performed on each of the oscillators in, for example, a final inspection process, and the state in which the optimum adjustment value is written in the memory 70 for each of the oscillators is achieved.

It should be noted that although in the flowchart shown in FIG. 5, the adjustment of the Vc sensitivity is performed while writing the adjustment values (VBSENS_ADJ, VCSENS_ADJ, VREFB_ADJ, and VREFC_ADJ) to the memory 70, it is also possible to, for example, previously provide an adjustment mode (a test mode) to the oscillator circuit 1, in which it is arranged that the adjustment values written in registers (not shown in FIG. 4) instead of the memory 70 are supplied to the load capacitance circuit 30, the load capacitance circuit 40, and the reference voltage adjustment circuit 50, respectively. Since rewriting of the adjustment values can promptly be performed by using the registers as described above, the period for adjusting the Vc sensitivity can be reduced.

Figure 7:
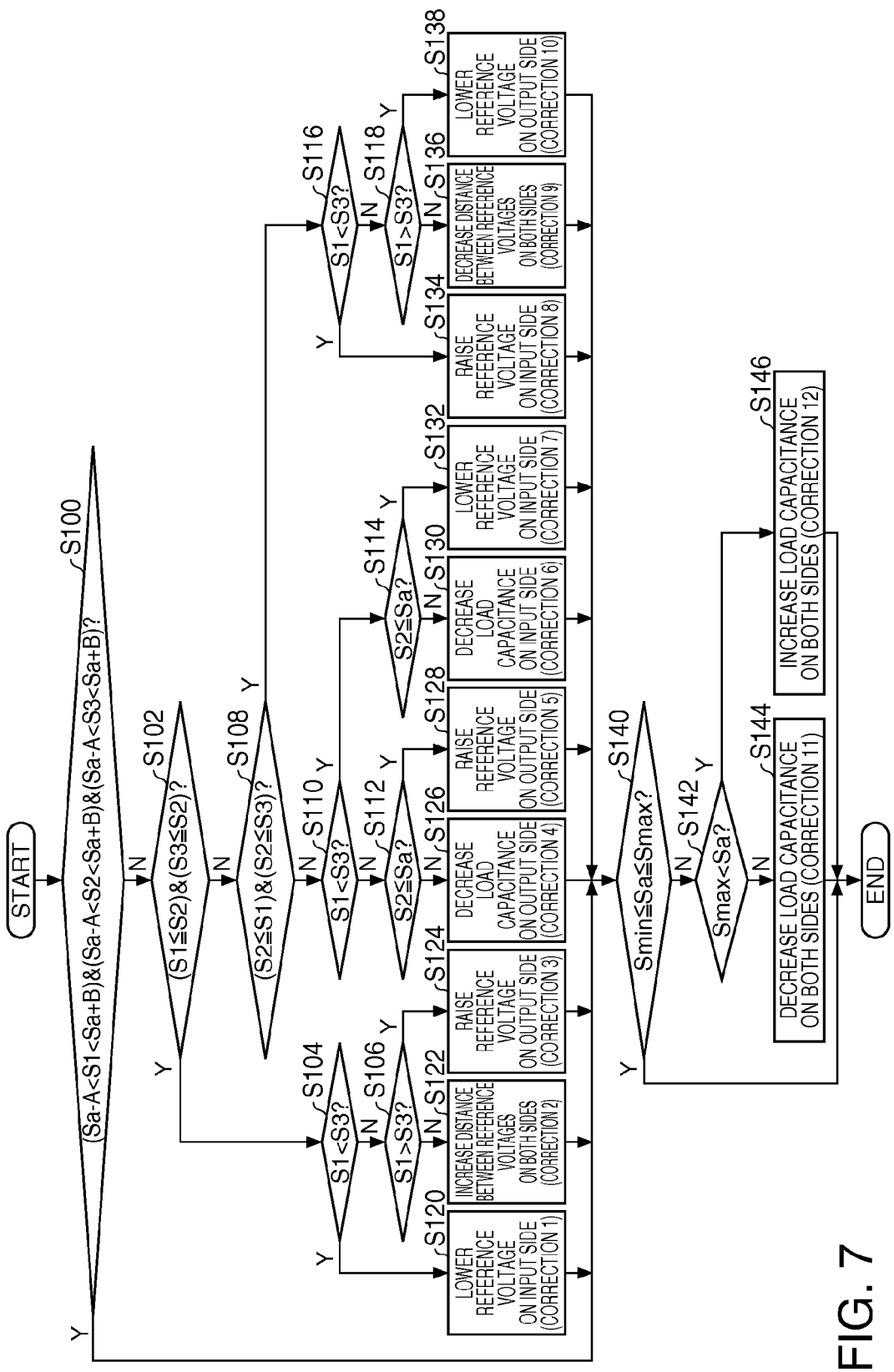
FIG. 7 is a flowchart showing an example of a method of calculating an optimum adjustment value.

FIG. 7 is a flowchart showing an example of the method (the calculation method in the step S40 shown in FIG. 5) of calculating the optimum adjustment value based on the Vc sensitivity values S1, S2, and S3 at the three points and the average value Va of the Vc sensitivity.

In the example shown in FIG. 7, firstly, whether or not all of S1, S2, and S3 fall within the range between Sa−A and Sa+B is determined (S100). Here, A represents the lowest allowable value of the shift of each of S1, S2, and S3 from Sa, and B represents the highest allowable value of the shift of each of S1, S2, and S3 from Sa.

In the step S100, if at least one of S1, S2, and S3 fails to fall within the range between Sa−A and Sa+B (N in S100), then, whether or not both of S1 and S3 are equal to or lower than S2 is determined (S102).

In the case in which both of S1 and S3 are equal to or lower than S2 (Y in S102) in the step S102, if S1<S3 is true (Y in S104), a correction 1 of modifying the adjustment value VREFB_ADJ to lower the reference voltage VREFB on the input side of the amplifier 10 is performed (S120). FIG. 8A is a diagram showing how the correction 1 is performed, wherein the solid line represents an image of the graph of the Vc sensitivity before the correction, and the dotted line represents an image of the graph of the Vc sensitivity after the correction.

Further, if S1=S3 is true (N in S104, and N in S106), there is performed (S122) a correction 2 of modifying both of the adjustment values VREFB_ADJ and VREFC_ADJ to increase the distance between the reference voltages VREFB, VREFC on both sides of the amplifier circuit 10. FIG. 8B is a diagram showing how the correction 2 is performed, wherein the solid line represents the image of the graph of the Vc sensitivity before the correction, and the dotted line represents the image of the graph of the Vc sensitivity after the correction.

Further, if S1>S3 is true (N in S104, and Y in S106), there is performed (S124) a correction 3 of modifying the adjustment value VREFC_ADJ to raise the reference voltage VREFC on the output side of the amplifier circuit 10. FIG. 8C is a diagram showing how the correction 3 is performed, wherein the solid line represents the image of the graph of the Vc sensitivity before the correction, and the dotted line represents the image of the graph of the Vc sensitivity after the correction.

On the other hand, in the step S102, if at least one of S1 and S3 is higher than S2 (N in S102), then, whether or not both of S1 and S3 are equal to or higher than S2 is determined (S108).

In the step S108, in the case in which at least one of S1 and S3 is lower than S2 (N in S108), if S1≥S3 is true (N in S110) and S2>Sa is true (N in S112), there is performed (S126) a correction 4 of modifying the adjustment value VCSENS_ADJ to reduce the load capacitance (to reduce the capacitance value of the load capacitance circuit 40) on the output side of the amplifier circuit 10. FIG. 8D is a diagram showing how the correction 4 is performed, wherein the solid line represents the image of the graph of the Vc sensitivity before the correction, and the dotted line represents the image of the graph of the Vc sensitivity after the correction.

Further, if S1≥S3 is true (N in S110), and S2≤Sa is true (Y in S112), there is performed (S128) a correction 5 of modifying the adjustment value VREFC_ADJ to raise the reference voltage VREFC on the output side of the amplifier circuit 10. FIG. 8E is a diagram showing how the correction 5 is performed, wherein the solid line represents the image of the graph of the Vc sensitivity before the correction, and the dotted line represents the image of the graph of the Vc sensitivity after the correction.

Further, if S1<S3 is true (Y in S110), and S2>Sa is true (N in S114), there is performed (S130) a correction 6 of modifying the adjustment value VBSENS_ADJ to reduce the load capacitance (reduce the capacitance value of the load capacitance circuit 30) on the input side of the amplifier circuit 10. FIG. 8F is a diagram showing how the correction 6 is performed, wherein the solid line represents the image of the graph of the Vc sensitivity before the correction, and the dotted line represents the image of the graph of the Vc sensitivity after the correction.

Further, if S1<S3 is true (Y in S110), and S2≤Sa is true (Y in S114), there is performed (S132) a correction 7 of modifying the adjustment value VREFB_ADJ to lower the reference voltage VREFB on the input side of the amplifier circuit 10. FIG. 9A is a diagram showing how the correction 7 is performed, wherein the solid line represents an image of the graph of the Vc sensitivity before the correction, and the dotted line represents the image of the graph of the Vc sensitivity after the correction.

On the other hand, in the case in which both of S1 and S3 are equal to or higher than S2 (Y in S108) in the step S108, if S1<S3 is true (Y in S116), a correction 8 of modifying the adjustment value VREFB_ADJ to raise the reference voltage VREFB on the input side of the amplifier circuit 10 is performed (S134). FIG. 9B is a diagram showing how the correction 8 is performed, wherein the solid line represents the image of the graph of the Vc sensitivity before the correction, and the dotted line represents the image of the graph of the Vc sensitivity after the correction.

Further, if S1=S3 is true (N in S116, and N in S118), there is performed (S136) a correction 9 of modifying both of the adjustment values VREFB_ADJ and VREFC_ADJ to decrease the distance between the reference voltages VREFB, VREFC on both sides of the amplifier circuit 10. FIG. 9C is a diagram showing how the correction 9 is performed, wherein the solid line represents the image of the graph of the Vc sensitivity before the correction, and the dotted line represents the image of the graph of the Vc sensitivity after the correction.

Further, if S1>S3 is true (N in S116, and Y in S118), there is performed (S138) a correction 10 of modifying the adjustment value VREFC_ADJ to lower the reference voltage VREFC on the output side of the amplifier circuit 10. FIG. 9D is a diagram showing how the correction 10 is performed, wherein the solid line represents the image of the graph of the Vc sensitivity before the correction, and the dotted line represents the image of the graph of the Vc sensitivity after the correction.

In the case in which S1, S2, and S3 all fall within the range between Sa-A and Sa+B (Y in S100), or after performing either of the correction 1 through the correction 10 (S120 through S138), whether or not Sa falls within a range between Smin and Smax is then determined (S140). Here, Smin represents the lowest allowable value of Sa, and Smax represents the highest allowable value of Sa.

In the step S140, in the case in which Sa fails to fall within the range between Smin and Smax (N in S140), if Sa<Smin is true (N in S142), there is performed (S144) a correction 11 of modifying both of the adjustment values VBSENS_ADJ and VCSENS_ADJ to reduce the load capacitance (to decrease both of the capacitance value of the load capacitance circuit 30 and the capacitance value of the load capacitance circuit 40) on both sides of the amplifier circuit 10. FIG. 9E is a diagram showing how the correction 11 is performed, wherein the solid line represents the image of the graph of the Vc sensitivity before the correction, and the dotted line represents the image of the graph of the Vc sensitivity after the correction.

On the other hand, if Smax<Sa is true (Y in S142), there is performed (S146) a correction 12 of modifying both of the adjustment values VBSENS_ADJ and VCSENS_ADJ to increase the load capacitance (increase both of the capacitance values of the load capacitance circuit 30 and the capacitance values of the load capacitance circuit 40) on both sides of the amplifier circuit 10. FIG. 9F is a diagram showing how the correction 12 is performed, wherein the solid line represents the image of the graph of the Vc sensitivity before the correction, and the dotted line represents the image of the graph of the Vc sensitivity after the correction.

In the case in which Sa falls within the range between Smin and Smax (Y in S140), or after performing the correction 11 or the correction 12 (S144 or S146), the calculation of the adjustment values is terminated, and the process proceeds to the step S50 shown in FIG. 5 explained above.

It should be noted that the necessary modification of the adjustment values in the correction 1 through the correction 12 can be performed, for example, by adding or subtracting a predetermined value to or from the current adjustment value, or can be performed by calculating the adjustment value based on some or all of the values S1, S2, S3, Sa, A, B, Smin, and Smax using predetermined calculating formulas.

As explained hereinabove, according to the oscillator circuit of the first embodiment, since it is arranged that the adjustment values of the reference voltage on the input side of the amplifier circuit, the reference voltage on the output side of the amplifier circuit, the load capacitance on the input side of the amplifier circuit, and the load capacitance on the output side of the amplifier circuit can independently be modified, the Vc sensitivity adjustment can more flexibly be performed in accordance with the variety of conditions such as the sensitivity of the resonator element, the level of the Vc sensitivity, and the oscillation amplitude of the oscillator. Thus, according to the oscillator circuit of the first embodiment, the Vc sensitivity adjustment and the Vc sensitivity variation correction with higher accuracy compared to the related art technology can be performed.

In particular, even in the case of using the oscillator at low Vc sensitivity or at a small oscillation amplitude, in which an appropriate Vc sensitivity adjustment has been difficult using the related art method, according to the oscillator circuit of the first embodiment, the Vc sensitivity adjustment and the Vc sensitivity variation correction with high accuracy can be performed.

1-3. Second Embodiment

Configuration

Figure 10:
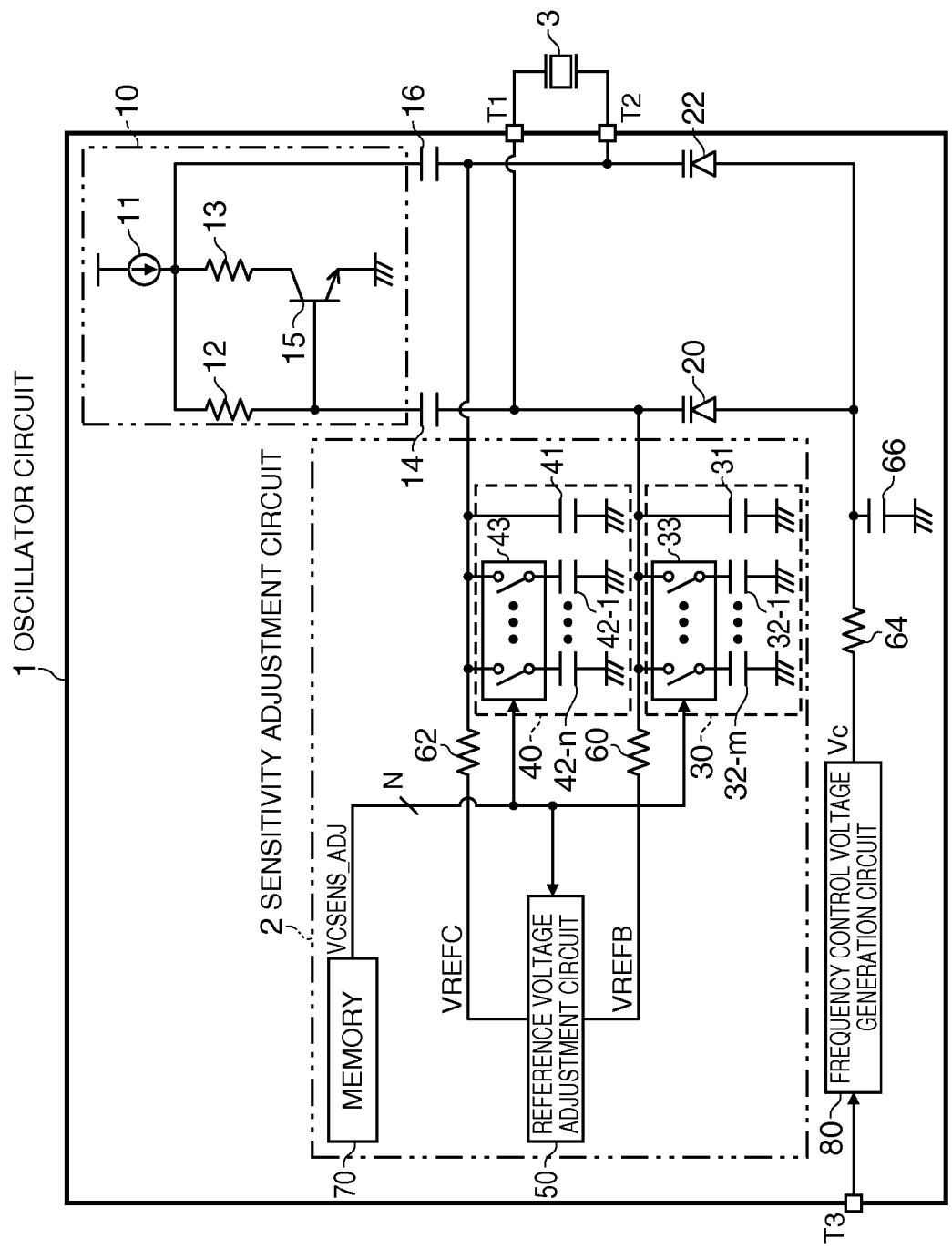
FIG. 10 is a diagram showing a configuration example of an oscillator circuit according to a second embodiment of the invention.

FIG. 10 is a diagram showing a configuration example of an oscillator circuit according to a second embodiment. In FIG. 10, the constituents corresponding to the constituents shown in FIGS. 1 and 4 are denoted with the same reference symbols as in FIGS. 1 and 4.

As shown in FIG. 10, the oscillator circuit 1 according to the second embodiment includes the amplifier circuit 10, the capacitors 14, 16, the variable capacitance elements 20, 22, the load capacitance circuit 30, the load capacitance circuit 40, the reference voltage adjustment circuit 50, the resistors 60, 62, 64, the capacitor 66, the memory 70, and the frequency control voltage generation circuit 80 similarly to the oscillator circuit 1 (FIG. 4) according to the first embodiment. It should be noted that the oscillator circuit 1 according to the present embodiment can have a configuration obtained by eliminating or modifying some of these constituents, or adding another constituent.

Unlike the first embodiment, the oscillator circuit 1 according to the second embodiment is configured so that all of the four parameters, namely the reference voltage VREFB, the reference voltage VREFC, the capacitance value of the load capacitance circuit 30, the capacitance value of the load capacitance circuit 40, are modified in conjunction with each other.

Specifically, the memory 70 stores the adjustment value VCSENS_ADJ represented in N bits, and when modifying VCSENS_ADJ, these four parameters are modified in conjunction with each other. Therefore, there is provided a configuration in which the Vc sensitivity adjustment in at most $2^N$ modes can only be performed. For example, in the case in which VCSENS_ADJ is represented in 2 bits, the Vc sensitivity adjustment in 4 modes shown in, for example, FIG. 11 can be performed.

In the example shown in FIG. 11, when VCSENS_ADJ [1:0] is "00," the four parameters described above are set in conjunction with each other so that the Vc sensitivity becomes the optimum in a mode (a mode 1) in which a type 1 vibrator is used, and the oscillator is made to operate with the Vc sensitivity of 50 ppm/V, and the oscillation amplitude of 1.2 V.

Further, when VCSENS_ADJ [1:0] is "01," the four parameters described above are set in conjunction with each other so that the Vc sensitivity becomes the optimum in a mode (a mode 2) in which a type 2 vibrator with high vibrator sensitivity is used, and the oscillator is made to operate with the Vc sensitivity of 50 ppm/V, and the oscillation amplitude of 1.2 V.

Further, when VCSENS_ADJ [1:0] is "10," the four parameters described above are set in conjunction with each other so that the Vc sensitivity becomes the optimum in a mode (a mode 3) in which the type 1 vibrator is used, and the oscillator is made to operate with the Vc sensitivity of 40 ppm/V, and the oscillation amplitude of 1.2 V.

Further, when VCSENS_ADJ [1:0] is "11," the four parameters described above are set in conjunction with each other so that the Vc sensitivity becomes the optimum in a mode (a mode 4) in which the type 1 vibrator is used, and the oscillator is made to operate with the Vc sensitivity of 50 ppm/V, and the oscillation amplitude of 0.8 V.

The optimum setting values of the four parameters described above in each of the modes are determined by previously performing a variety of calculations and simulations in the design phase so that the optimum Vc sensitivity can be obtained. It is also possible to obtain the optimum setting values by, for example, correcting the reference voltage VREFB, the reference voltage VREFC, the capacitance value of the load capacitance circuit 30, and the capacitance value of the load capacitance circuit 40 by substantially the same method as explained in the first embodiment (FIG. 7). Further, when using the oscillator, by rewriting the adjustment value VCSENS_ADJ in the memory 70 in accordance with the mode to be used, the optimum Vc sensitivity characteristics corresponding to the mode can automatically be obtained.

Other configurations in the oscillator circuit 1 according to the second embodiment are substantially the same as those of the first embodiment, and therefore, the explanation thereof will be omitted.

As explained hereinabove, according to the oscillator circuit of the second embodiment, the load capacitance and the reference voltages on both sides of the amplifier circuit are modified in conjunction with each other so that the optimum Vc sensitivity characteristics can be obtained in accordance with the mode in which the oscillator is used. As described above, according to the oscillator circuit of the second embodiment, the Vc sensitivity adjustment and the Vc sensitivity variation correction with high accuracy can be performed in accordance with the mode selected.

Further, according to the oscillator circuit of the second embodiment, since the load capacitance and the reference voltages on both sides of the amplifier circuit are modified in conjunction with each other, it is possible to reduce the number of bits of the adjustment values stored in the memory.

2. VIBRATORY DEVICE

The vibratory device according to the present embodiment includes the voltage-controlled oscillator circuit, and the resonator element (a vibrating body) oscillated by the oscillator circuit. As the vibratory device, there can be cited, for example, an oscillator equipped with a vibrator as a resonator element and a physical quantity sensor equipped with a vibratory sensing element as a resonator element.

FIG. 12A shows a configuration example of an oscillator as an example of the vibratory device. A vibratory device 200 (an oscillator) shown in FIG. 12A is a temperature-compensated oscillator, and includes an oscillator circuit 210, a temperature sensor 220, and a resonator element 230 such as a quartz crystal vibrator.

The oscillator circuit 210 internally generates the frequency control voltage Vc in accordance with an output signal of the temperature sensor 220 to thereby vary the capacitance value of the variable capacitance element in accordance with the temperature variation, and thus, oscillates the resonator element 230 at a regular frequency while compensating the frequency-temperature characteristic of the resonator element 230. The oscillator circuit 1 according to any one of the embodiments described above can be applied as the oscillator circuit 210.

As the oscillator, which is the vibratory device according to the present embodiment, a voltage-controlled oscillator (e.g., VCXO, VCSO), a voltage-controlled temperature-compensated oscillator (e.g., VC-TCXO), an oven controlled oscillator (e.g., OCXO), and so on can be cited besides the temperature-compensated oscillator (e.g., TCXO). Further, such an oscillator can also be a piezoelectric oscillator (e.g., a quartz crystal oscillator), a SAW oscillator, a silicon oscillator, an atomic oscillator, and so on irrespective of the material and the excitation device of the resonator element.

FIG. 12B shows a configuration example of a physical quantity sensor as an example of the vibratory device. A vibratory device 200 (a physical quantity sensor) shown in FIG. 12B includes the oscillator circuit 210, the temperature sensor 220, a sensor element 240 having quartz crystal or the like as a material, and a detector circuit 250.

The oscillator circuit 210 internally generates the frequency control voltage Vc in accordance with an output signal of the temperature sensor 220 to thereby vary the capacitance value of the variable capacitance element in accordance with the temperature variation, and thus, oscillates the sensor element 240 at a regular frequency while compensating the frequency-temperature characteristic of the sensor element 240. The oscillator circuit 1 according to any one of the embodiments described above can be applied as the oscillator circuit 210.

The sensor element 240 outputs a detection signal corresponding to the amount of the physical quantity (e.g., an angular velocity or an acceleration) applied to the sensor element 240 while vibrating at a regular frequency.

The detector circuit 250 performs detection and rectification of the detection signal of the sensor element 240, and thus generates and then outputs a physical quantity signal with a signal level corresponding to the amount of the physical quantity applied to the sensor element 240. It should be noted that it is also possible to arrange that the detector circuit 250 compensates the temperature characteristic of the circuit element and the temperature characteristic of the sensor element 240 in accordance with the output signal of the temperature sensor 220 to thereby adjust the vibration level of the physical quantity signal.

As the physical quantity sensor, which is the vibratory device according to the present embodiment, an angular velocity sensor (a gyro sensor), an acceleration sensor, and so on can be cited.

According to the present embodiment, since the Vc sensitivity of the vibratory device 200 can be adjusted with high accuracy using the oscillator circuit 210, the vibratory device 200 with high oscillation accuracy can be provided.

3. ELECTRONIC APPARATUS

Figure 13:
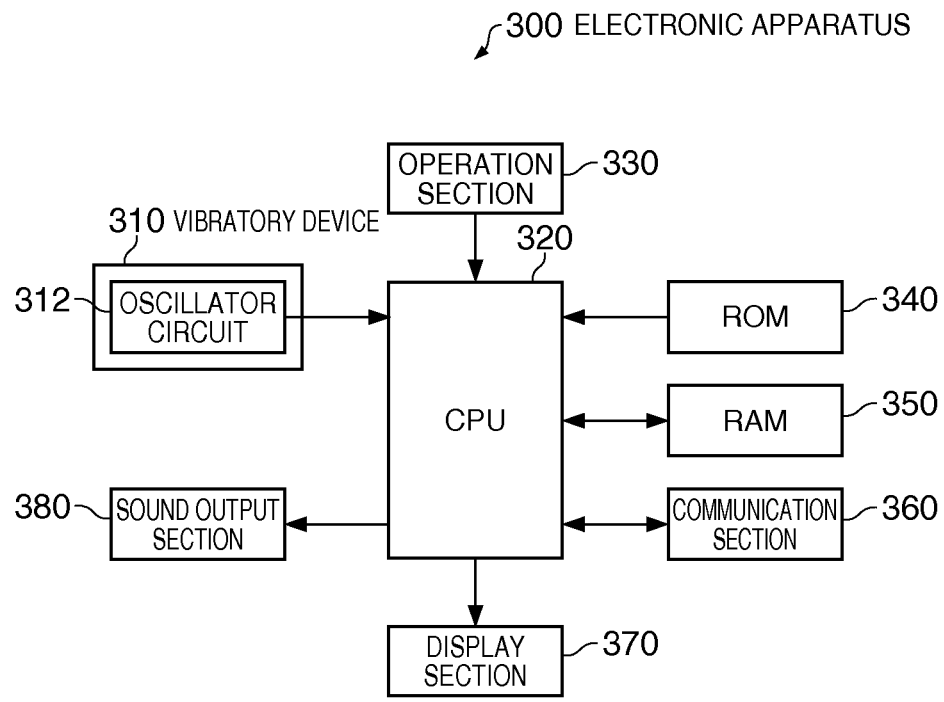
FIG. 13 is a functional block diagram of an electronic apparatus according to an embodiment of the invention.
Figure 14:
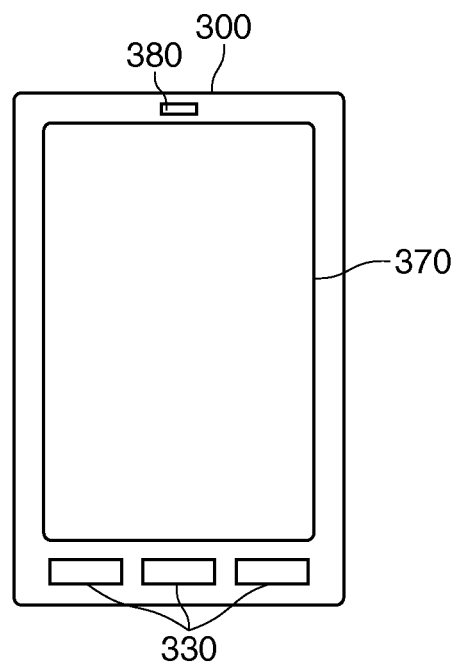
FIG. 14 is a diagram showing an example of an appearance of the electronic apparatus according to the embodiment.

FIG. 13 is a functional block diagram of an electronic apparatus according to the present embodiment. Further, FIG. 14 is a diagram showing an example of the appearance of a smartphone as an example of the electronic apparatus according to the present embodiment.

An electronic apparatus 300 according to the present embodiment is configured including an vibratory device 310, a central processing unit (CPU) 320, an operation section 330, a read only memory (ROM) 340, a random access memory (RAM) 350, a communication section 360, a display section 370, and a sound output section 380. It should be noted that the electronic apparatus according to the present embodiment can have a configuration obtained by eliminating or modifying some of the constituents (sections) shown in FIG. 13, or adding another constituent thereto.

The vibratory device 310 is, for example, an oscillator or a vibratory sensor including an oscillator circuit 312. As the oscillator circuit 312 and the vibratory device 310, the oscillator circuit 1 according to any of the embodiments described above and the vibratory device 200 can be applied.

The CPU 320 performs a variety of arithmetic processes and control processes using the signal generated by the vibratory device 310 in accordance with the program stored in the ROM 340 and so on. Besides the above, the CPU 320 performs a variety of processes corresponding to the operation signal from the operation section 330, a process of controlling the communication section 360 for performing data communication with external devices, a process of transmitting a display signal for making the display section 370 display a variety of types of information, a process of making the sound output section 380 output a variety of sounds, and so on.

The operation section 330 is an input device including operation keys, button switches, and so on, and outputs the operation signal corresponding to the operation by the user to the CPU 320.

The ROM 340 stores a program, data, and so on for the CPU 320 to perform a variety of arithmetic processes and control processes.

The RAM 350 is used as a working area of the CPU 320, and temporarily stores, for example, the program and data retrieved from the ROM 340, the data input from the operation section 330, and the calculation result obtained by the CPU 320 performing operations with the various programs.

The communication section 360 performs a variety of control processes for achieving the data communication between the CPU 320 and the external devices.

The display section 370 is a display device formed of a liquid crystal display (LCD) or the like, and displays a variety of information based on a display signal input from the CPU 320. The display section 370 can also be provided with a touch panel functioning as the operation section 330.

The sound output section 380 is a device, such as a speaker, for outputting sounds.

By incorporating the oscillator circuit 1 according to the present embodiment described above as the oscillator circuit 312, an electronic apparatus having higher reliability can be realized.

As such an electronic apparatus 300, a variety of electronic apparatuses can be adopted, and there can be cited, for example, a personal computer (e.g., a mobile type personal computer, a laptop personal computer, and a tablet personal computer), a mobile terminal such as a cellular phone, a digital still camera, an inkjet ejection device (e.g., an inkjet printer), a storage area network apparatus such as a router or a switch, a local area network apparatus, a base station apparatus for a mobile terminal, a television set, a video camera, a video cassette recorder, a car navigation system, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

4. MOVING OBJECT

Figure 15:
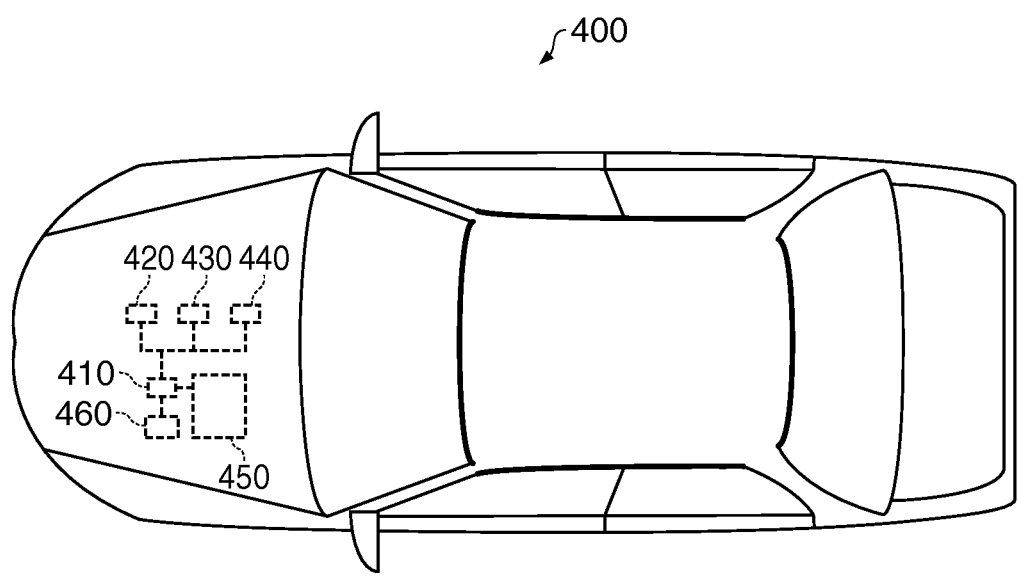
FIG. 15 is a diagram showing an example of a moving object according to an embodiment of the invention.

FIG. 15 is a diagram (a top view) showing an example of a moving object according to the present embodiment. A moving object 400 shown in FIG. 15 is configured including an oscillator circuit 410, controllers 420, 430, and 440 for performing a variety of types of control such as an engine system, a brake system, or a keyless entry system, a battery 450, and a backup battery 460. It should be noted that the moving object according to the present embodiment can have a configuration obtained by eliminating or modifying some of the constituents (sections) shown in FIG. 15, or adding another constituent thereto.

The oscillator circuit 1 according to any one of the embodiments described above can be applied as the oscillator circuit 410. It should be noted that the oscillator circuit 410 can also be replaced with a vibratory device (e.g., an oscillator or a physical quantity sensor) including the oscillator circuit 1. Although the detailed explanation of other constituents will be omitted, high reliability is required in order to perform the control necessary for the movement of the moving object. For example, the backup battery 460 is provided in addition to the battery 450 to thereby enhance the reliability.

It is also required for the oscillatory frequency of the oscillator circuit 410 to be a predetermined frequency irrespective of change in environment such as the temperature. By applying the oscillator circuit 1 according to any of the embodiments described above as the oscillator circuit 410, an accurate Vc sensitivity adjustment corresponding to a variety of environmental conditions can previously be performed, and therefore, high reliability can be ensured.

As such a moving object 400, a variety of types of moving objects can be adopted, and a vehicle (including an electric vehicle), an aircraft such a jet plane or a helicopter, a ship, a rocket, an artificial satellite, and so on can be cited.

5. MODIFIED EXAMPLES

The invention is not limited to the embodiments described above, but can be put into practice with various modifications within the scope or the spirit of the invention.

Modified Example 1

In the oscillator circuit according to the first embodiment, the procedure of the flowchart shown in FIG. 7 for calculating the optimum adjustment values in the Vc sensitivity adjustment method can be modified.

Figure 16:
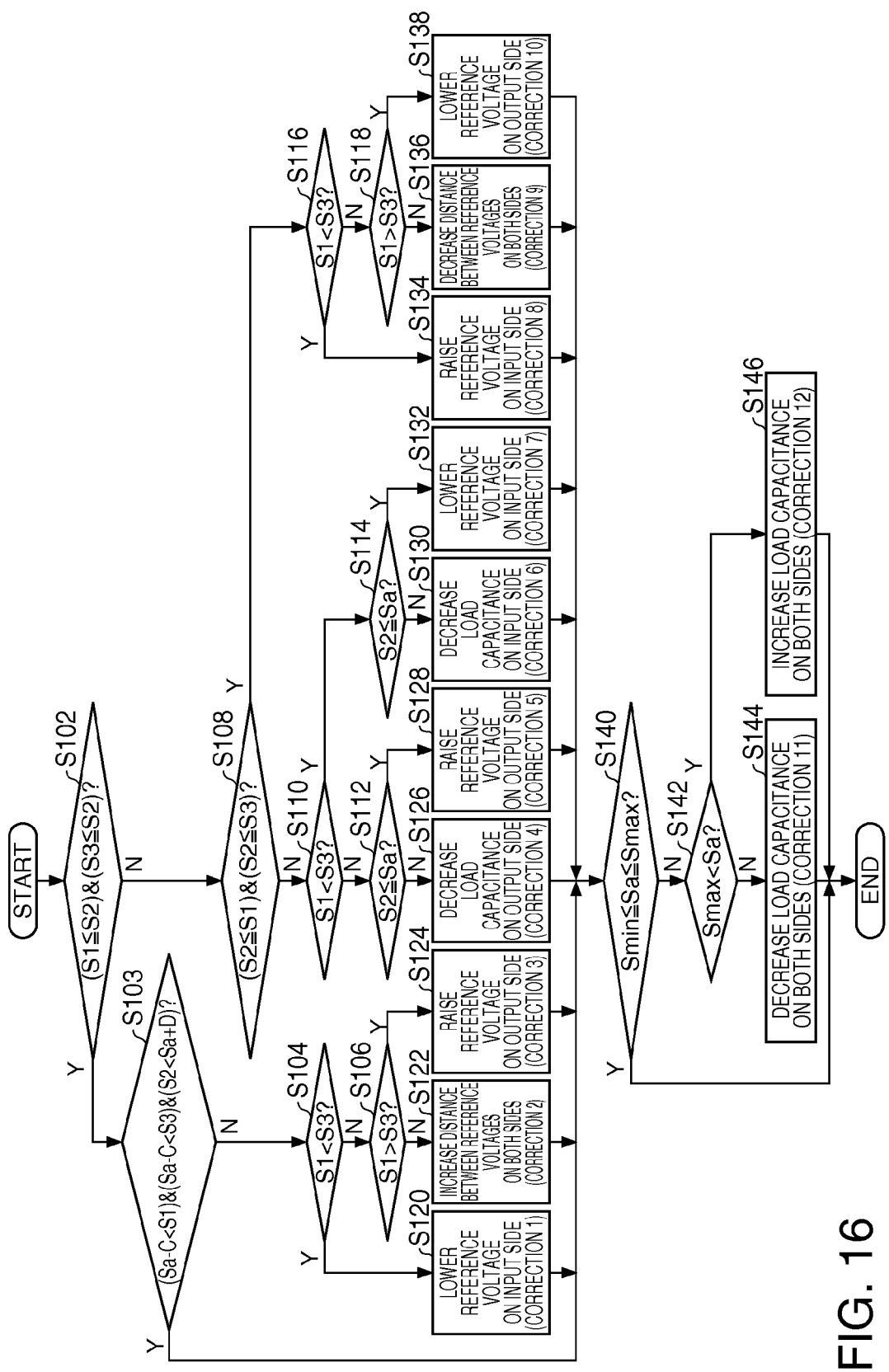
FIG. 16 is a flowchart showing a modified example of the method of calculating an optimum adjustment value.

FIG. 16 is a flowchart showing a modified example of the method (the calculation method in the step S40 shown in FIG. 5) of calculating the optimum adjustment values. In FIG. 16, the same steps as those shown in FIG. 7 are denoted with the same symbols.

In the example shown in FIG. 16, firstly, whether or not both of S1 and S3 are equal to or lower than S2 is determined (S102).

In the step S102, if both of S1 and S3 are equal to or lower than S2 (Y in S102), then whether or not both of S1 and S2 are higher than Sa−C, and S2 is lower than Sa+D is determined (S103). Here, C is an allowable value of the difference of S1, S2 from Sa, and D is an allowable value of the difference of S3 from Sa.

In the step S103, in the case in which S1 or S2 is equal to or lower than Sa−C, or S2 is equal to or higher than Sa+D (N in S103), the correction 1 (FIG. 8A) is performed (S120) if S1<S3 is true (Y in S104), the correction 2 (FIG. 8B) is performed (S122) if S1=S3 is true (N in S104, and N in S106), or the correction 3 (FIG. 8C) is performed (S124) if S1>S3 is true (N in S104, and Y in S106).

On the other hand, in the step S102, if at least one of S1 and S3 is higher than S2 (N in S102), the correction 4 through the correction 10 (FIGS. 8D through 8F, FIGS. 9A through 9D) are performed (S126 through S138) similarly to the case of FIG. 7.

In the step S103, in the case in which both of S1 and S2 are higher than Sa−C, and S2 is lower than Sa+D (Y in S103), or after performing either of the correction 1 through the correction 10 (S120 through S138), whether or not Sa falls within the range between Smin and Smax is then determined (S140). Thereafter, similarly to the case of FIG. 7, the correction 11 (FIG. 9E) or the correction 12 (FIG. 9F) is performed if necessary (S144, S146), and then the calculation of the adjustment values is terminated, and the process proceeds to the step S50 shown in FIG. 5 explained above.

Modified Example 2

Although the oscillator circuit according to the present embodiment is configured so that the four parameters, namely the reference voltage on the input side of the amplifier circuit, the reference voltage on the output side of the amplifier circuit, the load capacitance on the input side of the amplifier circuit, and the load capacitance on the output side of the amplifier circuit, can be changed, it is also possible to modify the configuration so that six parameters further including the variable capacitance element on the input side of the amplifier circuit and the variable capacitance element on the output side of the amplifier circuit can be changed.

Figure 17:
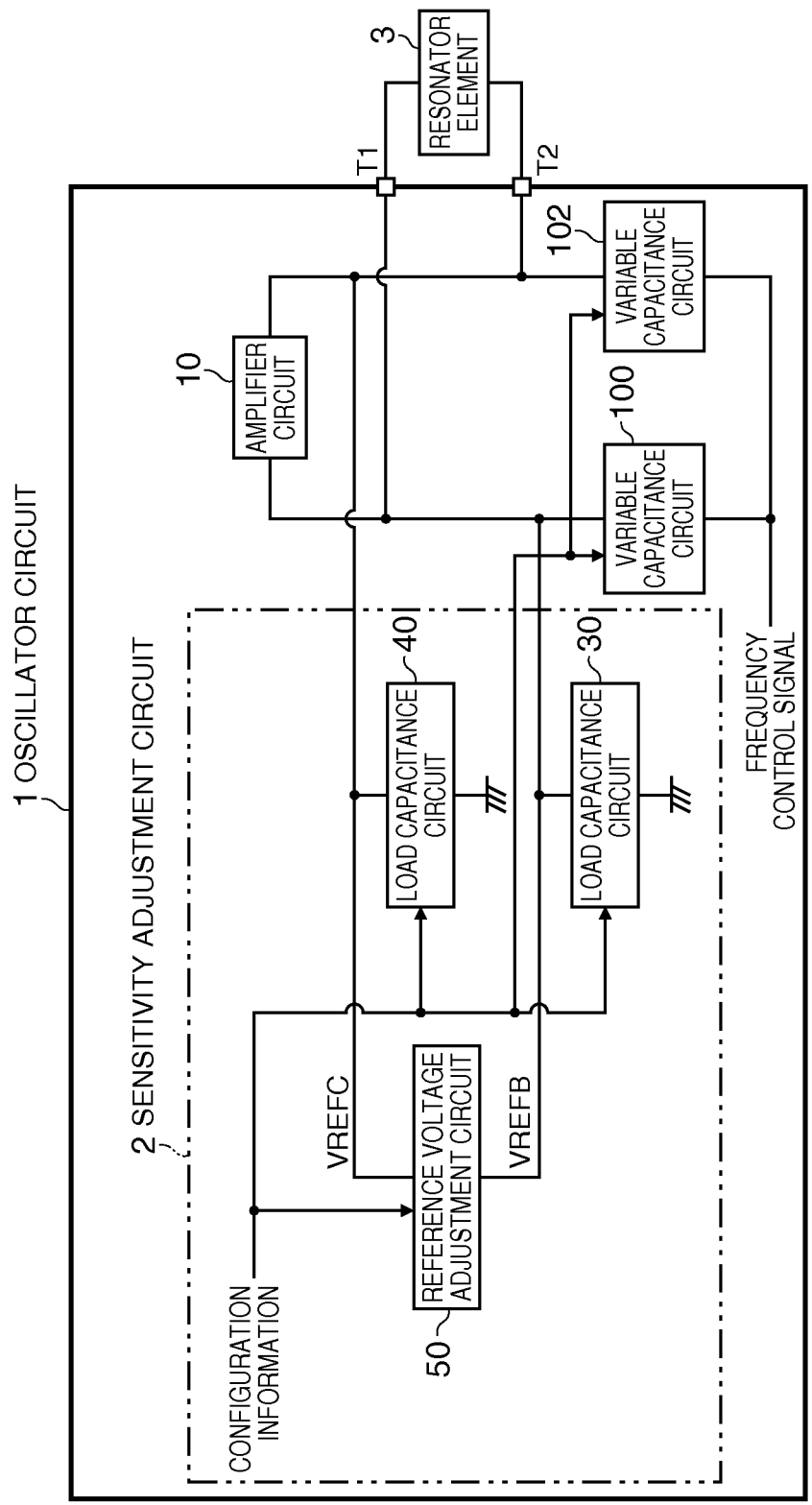
FIG. 17 is a schematic functional block diagram of an oscillator circuit according to a modified example.

FIG. 17 is a functional block diagram schematically showing an oscillator circuit according to the present modified example. In FIG. 17, the same constituents as those shown in FIG. 1 are denoted with the same reference symbols, and the explanation therefor will be omitted. As shown in FIG. 17, the oscillator circuit 1 according to the present modified example is configured so that the reference voltage VREFB, the reference voltage VREFC, the capacitance value of the load capacitance circuit 30, the capacitance value of the load capacitance circuit 40, the capacitance value of a variable capacitance circuit 100, and the capacitance value of a variable capacitance circuit 102 can be modified in accordance with the configuration information.

The variable capacitance circuit 100 and the variable capacitance circuit 102 are each configured as, for example, a variable capacitance bank including a plurality of variable capacitance elements and a plurality of switch elements, and the variable capacitance value is changed by selecting the variable capacitance elements to be connected to the terminal T1 or the terminal T2 by turning ON or OFF the switch elements in accordance with the configuration information.

The modifiable six parameters can individually be modified, or can be modified in conjunction with each other. Since a more specific configuration example of the oscillator circuit according to the present modified example can be obtained by appropriately modifying the configuration examples shown in FIGS. 4 and 10, the illustration thereof will be omitted.

According to the oscillator circuit of the present modified example, a finer Vc sensitivity adjustment becomes possible.

Modified Example 3

In the oscillator circuit according to the present embodiment, the individual reference voltages are input to the variable capacitance element 20 and the variable capacitance element 22, and at the same time, the common frequency control signal is input to the variable capacitance element 20 and the variable capacitance element 22. However, it is also possible to modify the oscillator circuit so that individual frequency control signals are input to the elements, and a common reference voltage is input to the elements.

Figure 18:
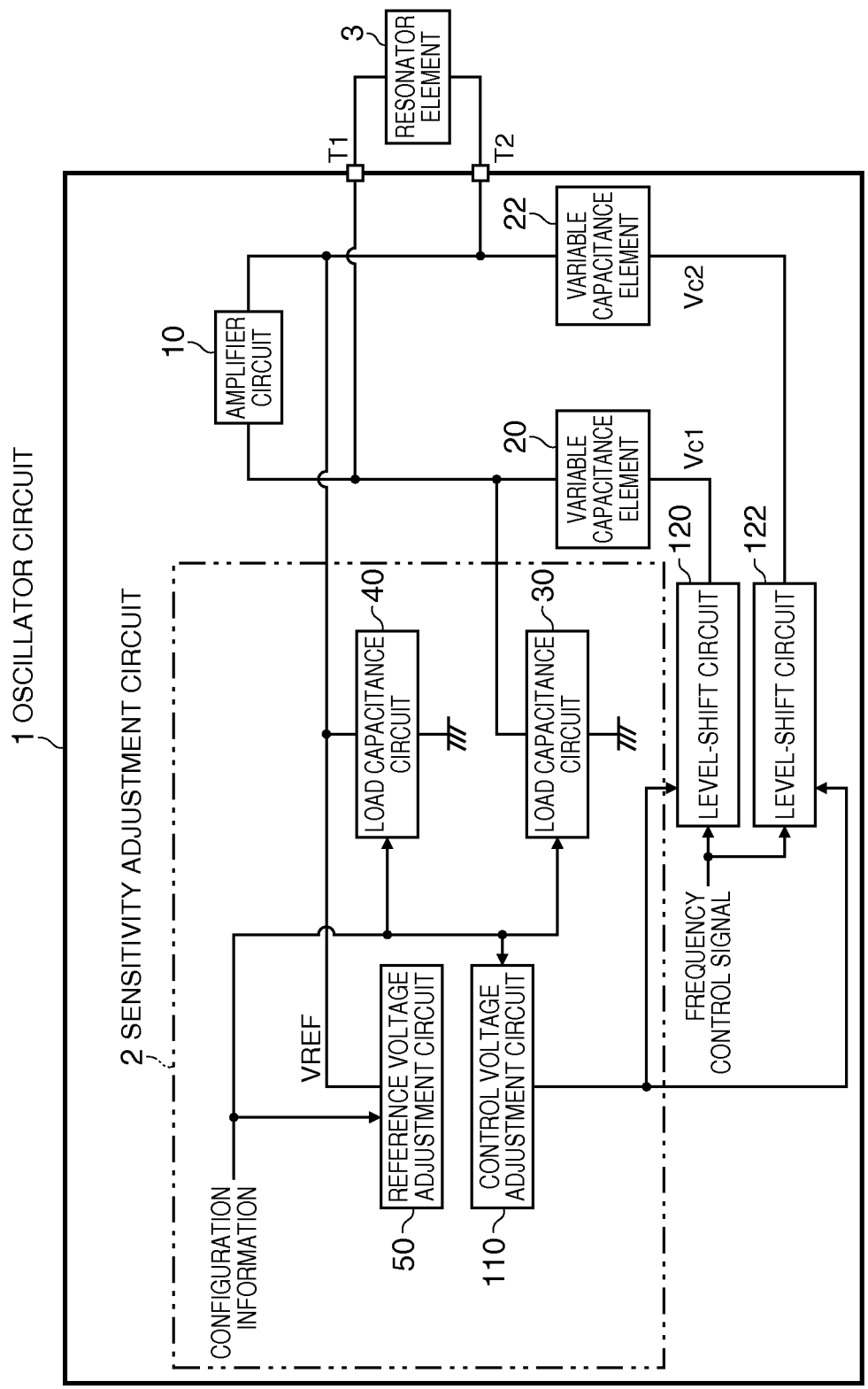
FIG. 18 is a schematic functional block diagram of an oscillator circuit according to a modified example.
Figure 19A:
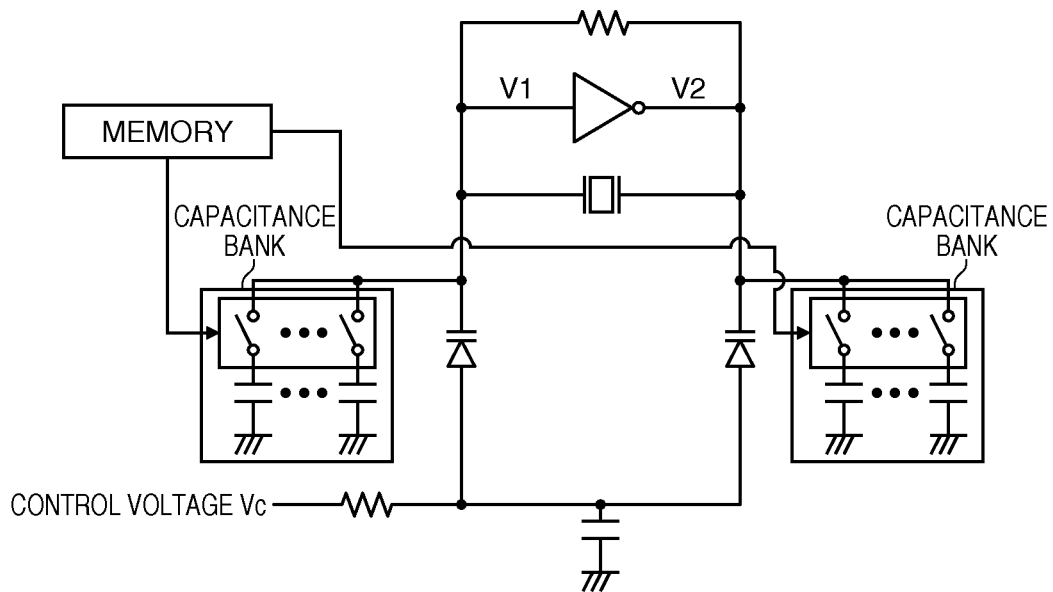
FIGS. 19A and 19B are each a circuit diagram of an oscillator of the related art.
Figure 19B:
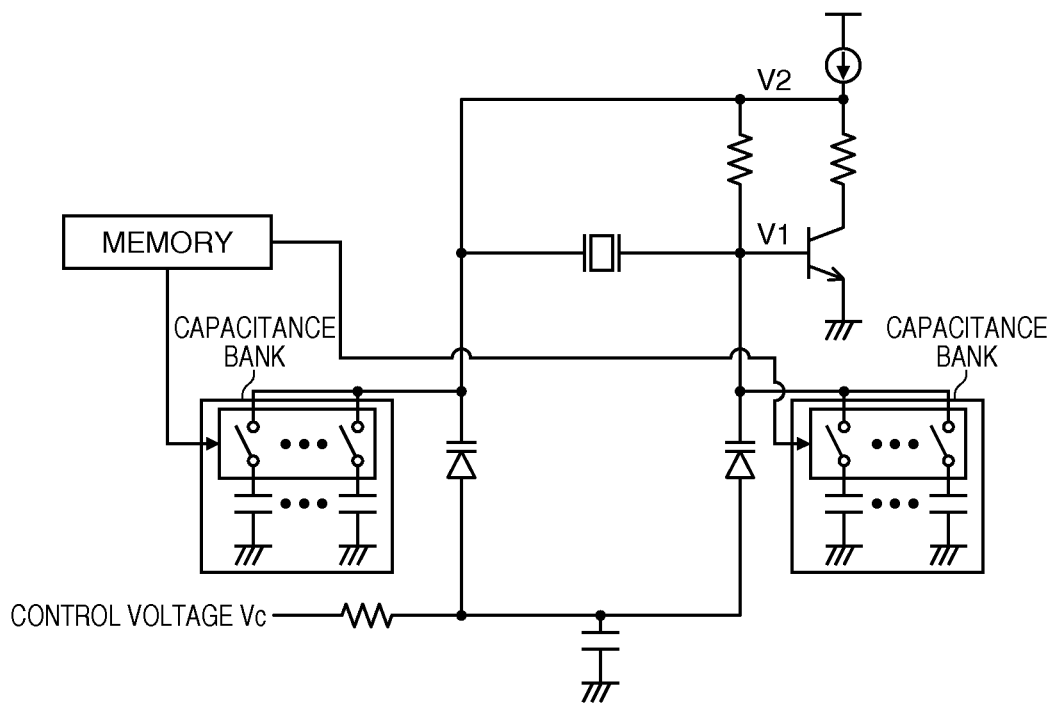

FIG. 18 is a functional block diagram schematically showing an oscillator circuit according to the present modified example. In FIG. 18, the same constituents as those shown in FIG. 1 are denoted with the same reference symbols, and the explanation therefor will be omitted. As shown in FIG. 18, the oscillator circuit 1 according to the present modified example is obtained by adding a control voltage adjustment circuit 110 and level-shift circuits 120, 122 to the oscillator circuit shown in FIG. 1.

The control voltage adjustment circuit 110 adjusts the output levels of the level-shift circuits 120, 122 in accordance with the configuration information.

A frequency control voltage Vc1 output by the level-shift circuit 120 is input to the variable capacitance element 20, and a frequency control voltage Vc2 output by the level-shift circuit 122 is input to the variable capacitance element 22.

Further, the reference voltage adjustment circuit 50 adjusts a reference voltage VREF in accordance with the configuration information, and supplies the reference voltage VREF commonly to the terminal T1 and the terminal T2 of the variable capacitance element 20.

In other words, the oscillator circuit according to the present modified example is configured so that the five parameters, namely the reference voltage VREF, the frequency control voltage Vc1, the frequency control voltage Vc2, the capacitance value of the load capacitance circuit 30, and the capacitance value of the load capacitance circuit 40, can be modified in accordance with the configuration information.

The modifiable five parameters can individually be modified, or can be modified in conjunction with each other. Since a more specific configuration example of the oscillator circuit according to the present modified example can be obtained by appropriately modifying the configuration examples shown in FIGS. 4 and 10, the illustration thereof will be omitted.

According to the oscillator circuit of the present modified example, a highly accurate Vc sensitivity adjustment similar to the oscillator circuit according to the present embodiment becomes possible.

Modified Example 4

The oscillator circuit according to the first embodiment is configured so that the four parameters, namely the reference voltage on the input side of the amplifier circuit, the reference voltage on the output side of the amplifier circuit, the load capacitance on the input side of the amplifier, and the load capacitance on the output side of the amplifier circuit, can be modified independently of each other with the respective adjustment values stored in the memory 70, and the oscillator circuit according to the second embodiment is configured so that all of the four parameters are modified in conjunction with each other. However, it is also possible to modify the oscillator circuit so that some of the four parameters can be modified independently, and the rest of the four parameters are modified in conjunction with each other.

For example, it is also possible to arrange that at least one of the capacitance value of the load capacitance circuit 30 and the capacitance value of the load capacitance circuit 40, and at least one of the reference voltage VREFB (the electrical potential of the terminal T1) and the reference voltage VREFC (the electrical potential of the terminal T2) are modified in accordance with the configuration information either in conjunction with each other, or individually.

According to such a configuration, it is possible to perform the Vc sensitivity adjustment, which is more flexible and highly accurate than in the case of the second embodiment, with a reduced number of bits of the adjustment values stored in the memory 70 compared to the case of the first embodiment. Therefore, it becomes possible to realize a low-cost oscillator within a range of fulfilling the required accuracy of the Vc sensitivity adjustment.

It should be noted that although the Vc sensitivity adjustment method of the oscillator as an example of the vibratory device is explained in the embodiments and the modified examples described above, a Vc sensitivity adjustment method substantially the same as that of the present embodiment can be applied to other vibratory devices such as a physical quantity sensor.

The embodiments and the modified examples described above are illustrative only, and the invention is not limited thereto. For example, it is also possible to arbitrarily combine the embodiments and the modified examples described above with each other.

The invention includes configurations (e.g., configurations having the same function, the same way, and the same result, or configurations having the same object and the same advantage) substantially the same as any of the configurations described as the embodiments of the invention. Further, the invention includes configurations obtained by replacing a non-essential part of the configuration described as the embodiment of the invention. Further, the invention includes configurations exerting the same functional effects and configurations capable of achieving the same object as any of the configurations described as the embodiments of the invention. Further, the invention includes configurations obtained by adding known technologies to any of the configurations described as the embodiments of the invention.

The entire disclosure of Japanese Patent Application No. 2012-217440, filed Sep. 28, 2012 is expressly incorporated by reference herein.

What is claimed is:

1. An oscillator circuit adapted to oscillate a resonator element at a frequency based on a frequency control signal, the oscillator circuit comprising:
 a load capacitance circuit;
 a first variable capacitance element, a capacitance value of which varies based on a first voltage applied to one end of the first variable capacitance element, and the frequency control signal applied to another end of the first variable capacitance element; and a second variable capacitance element, a capacitance value of which varies based on a second voltage applied to one end of the second variable capacitance element, and the frequency control signal applied to another end of the second variable capacitance element, wherein a capacitance value of the load capacitance circuit, the first voltage, and the second voltage are controlled in accordance with configuration information.

2. The oscillator circuit according to claim 1, further comprising:
a reference voltage adjustment circuit adapted to generate the first voltage based on the configuration information.

3. The oscillator circuit according to claim 1, wherein
the capacitance value of the load capacitance circuit and the first voltage are controlled independently of each other based on the configuration information.

4. The oscillator circuit according to claim 1, wherein
the capacitance value of the load capacitance circuit and the first voltage are controlled in conjunction with each other based on the configuration information.

5. The oscillator circuit according to claim 1, further comprising:
a reference voltage adjustment circuit adapted to generate the first voltage and the second voltage based on the configuration information.

6. The oscillator circuit according to claim 1, wherein
the capacitance value of the load capacitance circuit, the first voltage, and the second voltage are controlled independently of each other based on the configuration information.

7. The oscillator circuit according to claim 1, wherein
the capacitance value of the load capacitance circuit, the first voltage, and the second voltage are controlled in conjunction with each other based on the configuration information.

8. A vibratory device comprising:
oscillator circuit according to claim 1; and
a resonator element oscillated by the oscillator circuit.

9. An electronic apparatus comprising:
oscillator circuit according to claim 1.

10. A moving object comprising:
oscillator circuit according to claim 1.

11. A sensitivity adjustment circuit comprising:
a variable capacitance element, a capacitance value of which varies based on a first voltage applied to one end of the variable capacitance element, and a frequency control signal applied to another end of the variable capacitance element; and
a load capacitance element,
wherein a frequency control voltage sensitivity of a vibratory device varying in frequency is adjusted by varying the capacitance value of the variable capacitance element, and
a capacitance value of a load capacitance circuit and the first voltage are controlled based on configuration information.

12. A method of adjusting a vibratory device comprising:
providing the vibratory device including a resonator element, and an oscillator circuit having a load capacitance circuit, and a variable capacitance element, a capacitance value of which varies based on a first voltage applied to one end of the variable capacitance element, and a frequency control signal applied to another end of the variable capacitance element, and oscillating the resonator element at a frequency based on the frequency control signal;
measuring a frequency of the vibratory device corresponding to each of at least three signal values of the frequency control signal;
calculating frequency control voltage sensitivity of the vibratory device for each of the at least three signal values based on a measurement result of the measuring of a frequency; and
adjusting at least one of a capacitance value of the load capacitance circuit and the first voltage based on a calculation result obtained in the calculating of frequency control voltage sensitivity so that frequency control voltage sensitivity of the vibratory device is included in a allowable range.

* * * * *